United States Patent
Xu et al.

(10) Patent No.: US 9,543,903 B2
(45) Date of Patent: Jan. 10, 2017

(54) AMPLIFIERS WITH NOISE SPLITTING

(71) Applicant: QUALCOMM Incorporated, San Diego, CA (US)

(72) Inventors: Rui Xu, San Diego, CA (US); Li-Chung Chang, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 13/656,904

(22) Filed: Oct. 22, 2012

(65) Prior Publication Data

US 2014/0113578 A1  Apr. 24, 2014

(51) Int. Cl.
*H04B 1/06* (2006.01)
*H03F 1/22* (2006.01)
(Continued)

(52) U.S. Cl.
CPC .............. *H03F 1/223* (2013.01); *H03F 1/26* (2013.01); *H03F 3/19* (2013.01); *H03F 3/211* (2013.01);
(Continued)

(58) Field of Classification Search
CPC ....... H04B 1/10; H04B 1/16; H03F 2200/294; H03F 1/223; H03F 1/26; H03F 3/19; H03F 3/211; H03F 3/245; H03F 3/68; H03F 3/72
(Continued)

(56) References Cited

U.S. PATENT DOCUMENTS 3,911,364 A   10/1975 Langseth et al.
4,035,728 A   7/1977 Ishikawa et al.
(Continued)

FOREIGN PATENT DOCUMENTS

CN   1523912 A   8/2004
CN   1922795 A   2/2007
(Continued)

OTHER PUBLICATIONS

Jones W. W., et al., "Narrowband interference suppression using filter-bank analysis/synthesis techniques", Military Communications Conference, 1992. MILCOM '92, Conference Rec0r D. Communications—Fusing Command, Control and Intelligence., IEEE San Diego, CA, USA, Oct. 11 14, 1992, New York, NY, USA, IEEE, US, Oct. 11, 1992, pp. 898-902, XP010060840, DOI: 10.1109/MILCOM.1992.243977, ISBN: 978-0-7803-0585-4.

(Continued)

*Primary Examiner* — Nguyen Vo

(74) *Attorney, Agent, or Firm* — Liberty E. Mann

(57) ABSTRACT

Amplifiers with noise splitting to improve noise figure are disclosed. In an exemplary design, an apparatus (e.g., a wireless device, an integrated circuit, etc.) includes a plurality of amplifier circuits and at least one interconnection circuit. The amplifier circuits receive an input radio frequency (RF) signal. The interconnection circuit(s) are coupled between the plurality of amplifier circuits. Each interconnection circuit is closed to short the outputs or internal nodes of two amplifier circuits coupled to that interconnection circuit. The plurality of amplifier circuits may include a plurality of gain circuits coupled to a plurality of current buffers, one gain circuit and one current buffer for each amplifier circuit. Each amplifier circuit provides an output current, which may include a portion of the current from each of the plurality of gain circuits when the plurality of amplifier circuits are enabled.

16 Claims, 14 Drawing Sheets

(51) Int. Cl.
*H03F 1/26* (2006.01)
*H03F 3/19* (2006.01)
*H03F 3/21* (2006.01)
*H03F 3/24* (2006.01)
*H03F 3/68* (2006.01)
*H03F 3/72* (2006.01)

(52) U.S. Cl.
CPC ............... *H03F 3/245* (2013.01); *H03F 3/68* (2013.01); *H03F 3/72* (2013.01); H03F 2200/294 (2013.01); H03F 2200/421 (2013.01); H03F 2200/492 (2013.01); H03F 2200/537 (2013.01); H03F 2200/541 (2013.01); H03F 2203/21145 (2013.01)

(58) Field of Classification Search
USPC ................... 455/296, 303, 311; 330/51, 149
See application file for complete search history.

(56) References Cited

U.S. PATENT DOCUMENTS

| | | |
|---|---|---|
| 4,035,729 A | 7/1977 | Perry |
| 4,246,655 A | 1/1981 | Parker |
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |
| 5,056,411 A | 10/1991 | Baker |
| 5,128,630 A | 7/1992 | Mijuskovic |
| 5,291,519 A | 3/1994 | Tsurumaru |
| 5,321,850 A | 6/1994 | Backstrom et al. |
| 5,345,601 A | 9/1994 | Takagi et al. |
| 5,390,342 A | 2/1995 | Takayama et al. |
| 5,559,838 A | 9/1996 | Nakagoshi |
| 5,566,364 A | 10/1996 | Mizoguchi et al. |
| 5,694,396 A | 12/1997 | Firouzbakht et al. |
| 5,697,083 A | 12/1997 | Sano |
| 5,761,613 A | 6/1998 | Saunders et al. |
| 5,794,159 A | 8/1998 | Portin |
| 5,805,643 A | 9/1998 | Seki et al. |
| 5,805,989 A | 9/1998 | Ushida |
| 5,835,853 A | 11/1998 | Enoki et al. |
| 5,940,452 A | 8/1999 | Rich |
| 5,999,815 A | 12/1999 | TenBrook et al. |
| 5,999,990 A | 12/1999 | Sharrit et al. |
| 6,026,288 A | 2/2000 | Bronner |
| 6,040,732 A | 3/2000 | Brokaw |
| 6,044,254 A | 3/2000 | Ohta et al. |
| 6,063,961 A | 5/2000 | Kroner |
| 6,069,923 A | 5/2000 | Ostman et al. |
| 6,088,348 A | 7/2000 | Bell, III et al. |
| 6,208,844 B1 | 3/2001 | Abdelgany |
| 6,249,687 B1 | 6/2001 | Thomsen et al. |
| 6,407,689 B1 | 6/2002 | Bazarjani et al. |
| 6,424,683 B1 | 7/2002 | Schoellhorn |
| 6,430,237 B1 | 8/2002 | Anvari |
| 6,472,947 B1 | 10/2002 | Zeitz |
| 6,473,601 B1 | 10/2002 | Oda |
| 6,522,895 B1 | 2/2003 | Montalvo |
| 6,535,725 B2 | 3/2003 | Hatcher et al. |
| 6,600,759 B1 | 7/2003 | Wood |
| 6,600,907 B1 | 7/2003 | Taguchi |
| 6,600,931 B2 | 7/2003 | Sutton et al. |
| 6,657,498 B2 | 12/2003 | Park et al. |
| 6,806,777 B2 | 10/2004 | Franca-Neto |
| 6,819,941 B2 | 11/2004 | Dening et al. |
| 6,888,888 B1 | 5/2005 | Tu et al. |
| 6,952,594 B2 | 10/2005 | Hendin |
| 6,954,446 B2 | 10/2005 | Kuffner |
| 6,983,132 B2 | 1/2006 | Woo et al. |
| 6,985,712 B2 | 1/2006 | Yamakawa et al. |
| 6,987,950 B2 | 1/2006 | Coan |
| 7,013,166 B2 | 3/2006 | Clifford |
| 7,023,272 B2 | 4/2006 | Hung et al. |
| 7,024,172 B1 | 4/2006 | Murphy et al. |
| 7,039,377 B2 | 5/2006 | Yates |
| 7,123,891 B2 | 10/2006 | Loke |
| 7,142,042 B1 | 11/2006 | Henry |
| 7,161,423 B2 | 1/2007 | Paul et al. |
| 7,167,044 B2 | 1/2007 | Li et al. |
| 7,187,239 B2 | 3/2007 | Yeh |
| 7,187,735 B2 | 3/2007 | Kent, III |
| 7,187,904 B2 | 3/2007 | Gainey et al. |
| 7,212,788 B2 | 5/2007 | Weber et al. |
| 7,224,231 B2 | 5/2007 | Wu |
| 7,260,377 B2 | 8/2007 | Burns et al. |
| 7,283,851 B2 | 10/2007 | Persico et al. |
| 7,299,021 B2 | 11/2007 | Pärssinen et al. |
| 7,313,368 B2 | 12/2007 | Wu et al. |
| 7,317,894 B2 | 1/2008 | Hirose |
| 7,333,831 B2 | 2/2008 | Srinivasan et al. |
| 7,356,325 B2 | 4/2008 | Behzad et al. |
| 7,372,336 B2 | 5/2008 | Lee et al. |
| 7,403,508 B1 | 7/2008 | Miao |
| 7,444,166 B2 | 10/2008 | Sahota |
| 7,454,181 B2 | 11/2008 | Banister et al. |
| 7,477,106 B2 | 1/2009 | Van Bezooijen et al. |
| 7,486,135 B2 | 2/2009 | Mu |
| 7,486,941 B2 * | 2/2009 | Rahman ............... H03G 1/0088 455/234.1 |
| 7,570,111 B1 | 8/2009 | Vagher et al. |
| 7,599,675 B2 | 10/2009 | Mu et al. |
| 7,643,847 B2 | 1/2010 | Daanen et al. |
| 7,643,848 B2 | 1/2010 | Robinett |
| 7,697,905 B2 | 4/2010 | Lee et al. |
| 7,728,664 B2 | 6/2010 | Chang et al. |
| 7,751,513 B2 | 7/2010 | Eisenhut et al. |
| 7,764,726 B2 | 7/2010 | Simic et al. |
| 7,848,724 B2 | 12/2010 | Bult et al. |
| 7,869,528 B2 | 1/2011 | Robinson |
| 7,877,075 B1 | 1/2011 | Jin et al. |
| 7,911,269 B2 | 3/2011 | Yang et al. |
| 7,944,298 B2 | 5/2011 | Cabanillas et al. |
| 7,949,309 B2 | 5/2011 | Rofougaran et al. |
| 7,952,398 B2 | 5/2011 | Salcido et al. |
| 8,019,314 B2 * | 9/2011 | Tomiyama ............... H04B 1/30 327/359 |
| 8,022,772 B2 | 9/2011 | Cassia et al. |
| 8,055,229 B2 | 11/2011 | Huang |
| 8,063,706 B2 | 11/2011 | Li et al. |
| 8,081,672 B2 | 12/2011 | Kent et al. |
| 8,090,332 B2 | 1/2012 | Sahota et al. |
| 8,090,369 B2 | 1/2012 | Kitazoe |
| 8,139,670 B1 | 3/2012 | Son et al. |
| 8,149,955 B2 | 4/2012 | Tired |
| 8,195,117 B2 | 6/2012 | Bult et al. |
| 8,208,887 B2 | 6/2012 | Lee et al. |
| 8,217,723 B2 | 7/2012 | Rajendran et al. |
| 8,242,841 B2 | 8/2012 | Zhang |
| 8,270,927 B2 | 9/2012 | Wallace et al. |
| 8,290,449 B2 | 10/2012 | Keehr et al. |
| 8,295,778 B2 | 10/2012 | Kotecha et al. |
| 8,306,494 B2 | 11/2012 | Ojo |
| 8,442,473 B1 | 5/2013 | Kaukovuori et al. |
| 8,514,015 B2 | 8/2013 | Chen |
| 8,571,510 B2 | 10/2013 | Liu et al. |
| 8,600,315 B2 | 12/2013 | Roufoogaran et al. |
| 8,626,084 B2 | 1/2014 | Chan et al. |
| 8,676,148 B2 | 3/2014 | Ogasawara |
| 8,706,069 B2 * | 4/2014 | Khoini-Poorfard et al. .. 455/266 |
| 2002/0008575 A1 | 1/2002 | Oskowsky et al. |
| 2002/0061773 A1 | 5/2002 | Adachi et al. |
| 2002/0111163 A1 | 8/2002 | Hamabe |
| 2002/0132597 A1 | 9/2002 | Peterzell et al. |
| 2002/0173337 A1 | 11/2002 | Hajimiri et al. |
| 2002/0193108 A1 | 12/2002 | Robinett |
| 2003/0076797 A1 | 4/2003 | Lozano |
| 2003/0081694 A1 | 5/2003 | Wieck |
| 2003/0125040 A1 | 7/2003 | Walton et al. |
| 2003/0148750 A1 | 8/2003 | Yan et al. |
| 2003/0157915 A1 | 8/2003 | Atkinson et al. |
| 2003/0176176 A1 | 9/2003 | Leinonen et al. |

(56) References Cited

U.S. PATENT DOCUMENTS

| | | |
|---|---|---|
| 2003/0203743 A1 | 10/2003 | Sugar et al. |
| 2003/0206076 A1 | 11/2003 | Hashemi et al. |
| 2003/0228851 A1 | 12/2003 | Taniguchi |
| 2004/0014435 A1* | 1/2004 | Woo .................. H04B 1/406 455/103 |
| 2004/0087290 A1 | 5/2004 | Schmidt et al. |
| 2004/0092243 A1 | 5/2004 | Hey-Shipton |
| 2004/0113746 A1 | 6/2004 | Brindle |
| 2004/0116086 A1 | 6/2004 | Huttunen |
| 2004/0121753 A1 | 6/2004 | Sugar et al. |
| 2004/0204104 A1 | 10/2004 | Horng et al. |
| 2004/0219959 A1 | 11/2004 | Khayrallah et al. |
| 2004/0224643 A1 | 11/2004 | Nakai |
| 2004/0253955 A1 | 12/2004 | Love et al. |
| 2004/0266356 A1 | 12/2004 | Javor et al. |
| 2005/0039060 A1 | 2/2005 | Okayasu |
| 2005/0075077 A1 | 4/2005 | Mach et al. |
| 2005/0079847 A1 | 4/2005 | Arafa |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |
| 2005/0231290 A1 | 10/2005 | Hung et al. |
| 2005/0265084 A1 | 12/2005 | Choi |
| 2005/0277387 A1 | 12/2005 | Kojima et al. |
| 2006/0009177 A1 | 1/2006 | Persico et al. |
| 2006/0023745 A1 | 2/2006 | Koo et al. |
| 2006/0061773 A1 | 3/2006 | Lee et al. |
| 2006/0121937 A1 | 6/2006 | Son |
| 2006/0128322 A1 | 6/2006 | Igarashi et al. |
| 2006/0146693 A1 | 7/2006 | Mori et al. |
| 2006/0170503 A1 | 8/2006 | Lee et al. |
| 2006/0189286 A1 | 8/2006 | Kyu et al. |
| 2006/0222100 A1 | 10/2006 | Behzad |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0082642 A1* | 4/2007 | Hattori ................. H03H 9/542 455/286 |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0204148 A1* | 8/2008 | Kim et al. .................. 330/306 |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1 | 12/2008 | Mu |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1 | 2/2010 | Liu et al. |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1* | 8/2011 | Hu et al. .................. 330/124 R |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1* | 2/2013 | Hadjichristos et al. ...... 330/252 |
| 2013/0051284 A1 | 2/2013 | Khlat |
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316668 A1 | 11/2013 | Davierwalla et al. |
| 2013/0316669 A1 | 11/2013 | Davierwalla et al. |
| 2013/0316670 A1 | 11/2013 | Tasic et al. |
| 2013/0329665 A1 | 12/2013 | Kadous et al. |
| 2014/0018026 A1* | 1/2014 | Klepser .................. H04B 1/005 455/230 |
| 2014/0072001 A1 | 3/2014 | Chang et al. |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |

(56) References Cited

FOREIGN PATENT DOCUMENTS

| | | |
|---|---|---|
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2001285114 | 10/2001 |
| JP | 2002261880 A | 9/2002 |
| JP | 2004015162 A | 1/2004 |
| JP | 2006520143 A | 8/2006 |
| JP | 2007324711 A | 12/2007 |
| JP | 2008085793 A | 4/2008 |
| JP | 2008519535 A | 6/2008 |
| JP | 2009130867 A | 6/2009 |
| JP | 2011015112 A | 1/2011 |
| JP | 2011082669 A | 4/2011 |
| JP | 2011091747 A | 5/2011 |
| JP | 2011119807 A | 6/2011 |
| WO | WO0150636 | 7/2001 |
| WO | 0237686 | 5/2002 |
| WO | WO2005039060 | 4/2005 |
| WO | 2005062477 A2 | 7/2005 |
| WO | WO2005064816 A1 | 7/2005 |
| WO | 2005088847 A1 | 9/2005 |
| WO | WO2005104389 A1 | 11/2005 |
| WO | 2006050515 A2 | 5/2006 |
| WO | 2006118538 A2 | 11/2006 |
| WO | 2008059257 A1 | 5/2008 |
| WO | 2008084539 A1 | 7/2008 |
| WO | 2008103757 | 8/2008 |
| WO | WO2008092745 A1 | 8/2008 |
| WO | 2008145604 A1 | 12/2008 |
| WO | 2010059257 A1 | 5/2010 |
| WO | 2011019850 A1 | 2/2011 |
| WO | WO2011050729 A1 | 5/2011 |
| WO | WO2011092005 A1 | 8/2011 |
| WO | 2011138697 A1 | 11/2011 |
| WO | 2012008705 A2 | 1/2012 |
| WO | 2012049529 A1 | 4/2012 |
| WO | 2013036794 A1 | 3/2013 |
| WO | 2013131047 | 9/2013 |

OTHER PUBLICATIONS

Lai, C.M., et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.
International Search Report and Written Opinion—PCT/US2013/066230—ISAEPO—Dec. 3, 2013.
3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.
Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers.
Broyde, et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.
Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.
Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, 2006, pp. 197-199.
Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.
Hashemi, et al., "Concurrent Multiband Low-Noise Amplifiers—Theory, Design, and Applications," IEEE Transactions on Microwave Theory and Techniques, vol. 50, No. 1, Jan. 2002.
Henrik M et al., "A Full Duplex Front End Module for WiFi 802.11.n Applications", European Microwave Association, vol. 12, No. 4, Oct. 2008, pp. 162-165.
Jussi R et al., "A Dual-Band RF Front-End for WCDMA and GSM Applications", IEEE, Journal Solid-State Circuits, 2001, vol. 36, No. 8, pp. 1198-1204.
Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.
Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.
Rahn D.G., et al., "A fully integrated multiband MIMO WLAN transceiver RFIC," IEEE J. Solid-State Circuits, 2005, vol. 40 (8), 1629-1641.
Sever et al. "A Dual-Antenna Phase-Array Ultra-Wideband CMOS Transceiver". IEEE Communications Magazine [Online] 2006, vol. 44, Issue 8, pp. 102-110. See pp. 104-107.
Tasic A. et al., "Design of Adaptive Multimode RF Front-End Circuits", IEEE Journal of Solid-State Circuits, vol. 42, Issue 2, Feb. 2007 pp. 313-322.
Winternitz, et al., "A GPS Receiver for High-Altitude Satellite Navigation," IEEE Journal of Selected Topics in Signal Processing, vol. 3, No. 4, pp. 541-556, Aug. 2009.
Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.
Hwang, et al., "A High IIP2 Direct-Conversion Receiver using Even-Harmonic Reduction Technique for Cellular CDMA/PCS/GPS applications," IEEE Transaction on Circuits and Systems, 2008.
Kevin W et al., "3G/4G Multimode Cellular Front End Challenges", Part 2: Architecture Discussion, RFMD® White Paper, 2009, 9 pages.
Lee et al., "Development of Miniature Quad SAW filter bank based on PCB substrate", IEEE Intl Frequency Control Symp, pp. 146-149, 2007.
MSM6000 Chipset Solution, Qualcomm Incorporated, 2003.
MSM6500 Chipset Solution, Qualcomm Incorporated, 2004.
Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, No. Dresden, Germany; 20100628, Jun. 22, 2010, XP050449298, [retrieved on Jun. 22, 2010] the whole document.
Qualcomm Europe: "UE Implementation Impact due to 4C-HSDPA Operation", 3GPP Draft; R1-094067_UE_IMPL_IMPACT_4C_HSDPA, 3rd Generation Partnership Project (3GPP), Mobile Competence Centre; 650, Route Des Lucioles ; F-06921 Sophia-Antipolis Cedex ; France, No. Miyazaki; 20091012, Oct. 12, 2009, XP050388547, [retrieved on Oct. 6, 2009].

(56) References Cited

OTHER PUBLICATIONS

"UMTS Picocell Front End Module", CTS Corp., 2007, 8 pages.

* cited by examiner

AMPLIFIERS WITH NOISE SPLITTING

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifier with noise splitting and having good performance and other desirable characteristics are disclosed herein. These amplifiers may include SIMO LNAs supporting simultaneous reception of multiple transmitted signals. These amplifiers may be used for various types of electronic devices such as wireless communication devices.

Figure 1:
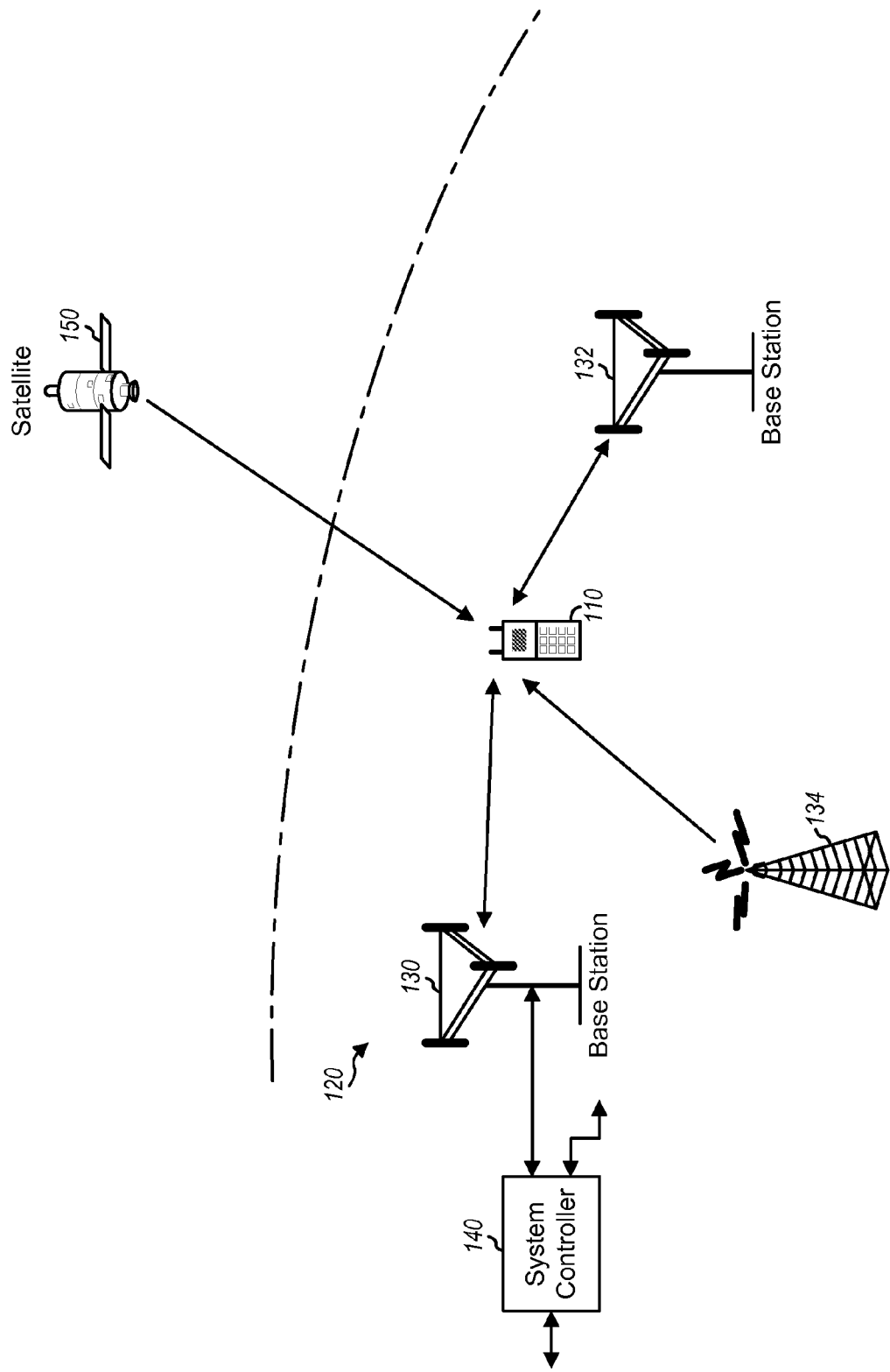
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
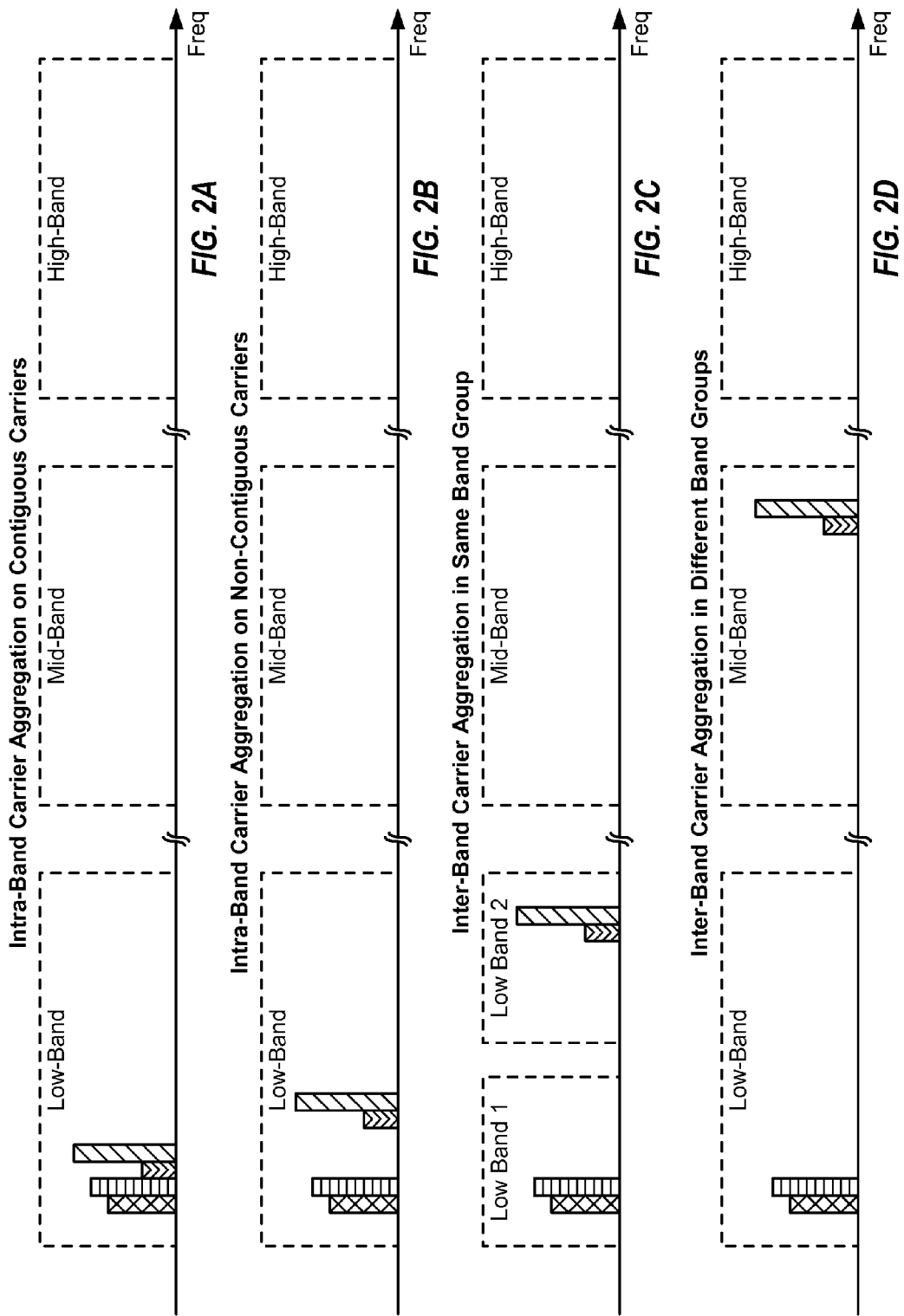
FIGS. 2A to 2D show four examples of carrier aggregation (CA).

FIG. 2A shows an example of contiguous intra-band CA. In the example shown in FIG. 2A, wireless device 110 is configured with four contiguous carriers in one band in low-band. Wireless device 110 may send and/or receive transmissions on multiple contiguous carriers within the same band.

FIG. 2B shows an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on multiple non-contiguous carriers within the same band.

FIG. 2C shows an example of inter-band CA in the same band group. In the example shown in FIG. 2C, wireless device 110 is configured with four carriers in two bands in low-band. Wireless device 110 may send and/or receive transmissions on multiple carriers in different bands in the same band group.

FIG. 2D shows an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on multiple carriers in different bands in different band groups.

FIGS. 2A to 2D show four examples of carrier aggregation. Carrier aggregation may also be supported for other combinations of bands and band groups.

Figure 3:
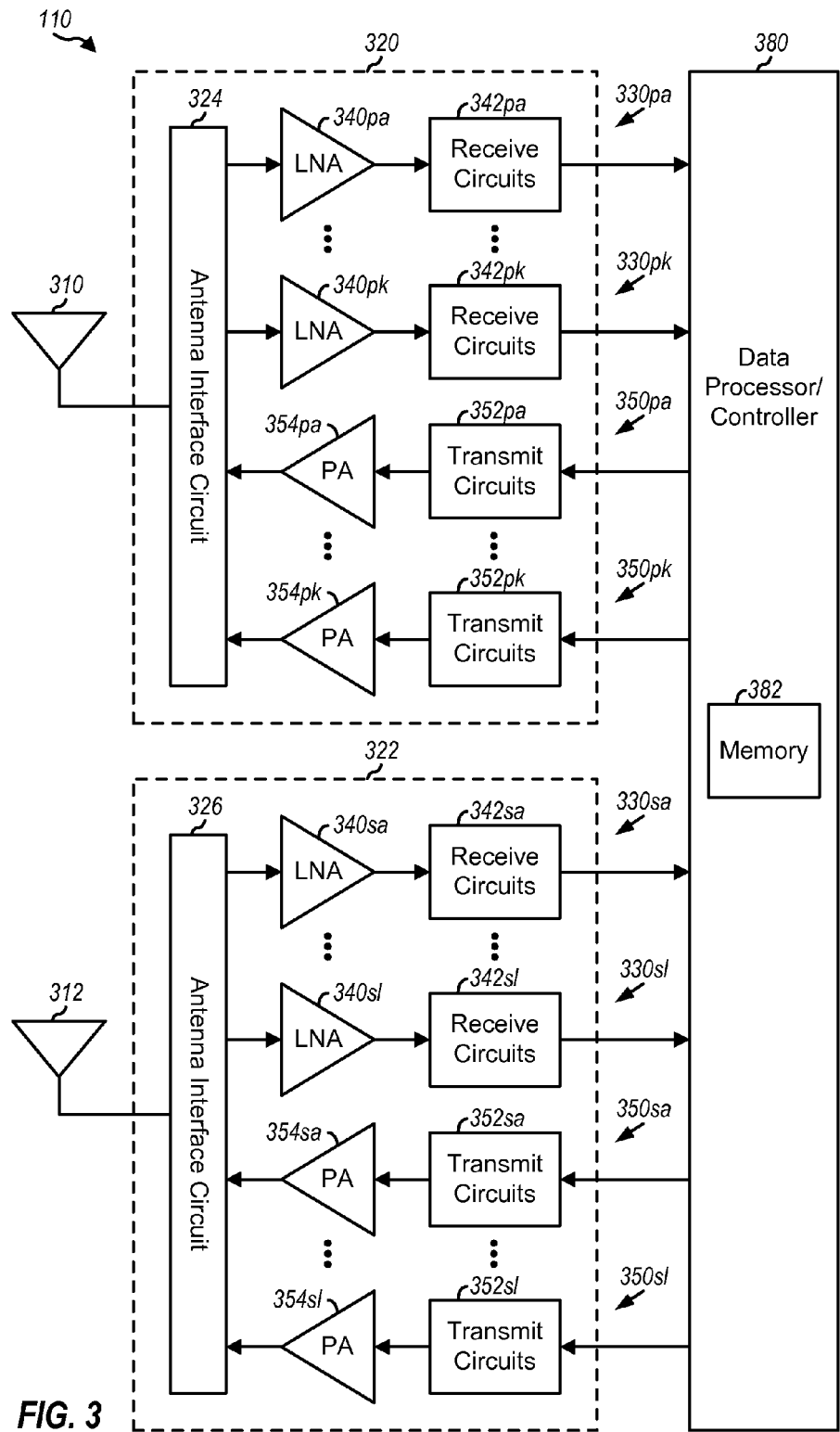
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes multiple (K) receivers 330pa to 330pk and multiple (K) transmitters 350pa to 350pk to support multiple frequency bands, multiple radio technologies, carrier aggregation, etc. Transceiver 322 includes L receivers 330sa to 330sl and L transmitters 350sa to 350sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 3, each receiver 330 includes an LNA 340 and receive circuits 342. For data reception, antenna 310 receives signals from base stations and/or other transmitter stations and provides a received RF signal, which is routed through an antenna interface circuit 324 and presented as an input RF signal to a selected receiver. Antenna interface circuit 324 may include switches, duplexers, transmit filters, receive filters, matching circuits, etc. The description below assumes that receiver 330pa is the selected receiver. Within receiver 330pa, an LNA 340pa amplifies the input RF signal and provides an output RF signal. Receive circuits 342pa downconvert the output RF signal from RF to baseband, amplify and filter the downconverted signal, and provide an analog input signal to data processor 380. Receive circuits 342pa may include mixers, filters, amplifiers, matching circuits, an oscillator, a local oscillator (LO) generator, a phase locked loop (PLL), etc. Each remaining receiver 330 in transceivers 320 and 322 may operate in similar manner as receiver 330pa.

In the exemplary design shown in FIG. 3, each transmitter 350 includes transmit circuits 352 and a power amplifier (PA) 354. For data transmission, data processor 380 processes (e.g., encodes and modulates) data to be transmitted and provides an analog output signal to a selected transmitter. The description below assumes that transmitter 350pa is the selected transmitter. Within transmitter 350pa, transmit circuits 352pa amplify, filter, and upconvert the analog output signal from baseband to RF and provide a modulated RF signal. Transmit circuits 352pa may include amplifiers, filters, mixers, matching circuits, an oscillator, an LO generator, a PLL, etc. A PA 354pa receives and amplifies the modulated RF signal and provides a transmit RF signal having the proper output power level. The transmit RF signal is routed through antenna interface circuit 324 and transmitted via antenna 310. Each remaining transmitter 350 in transceivers 320 and 322 may operate in similar manner as transmitter 350pa.

FIG. 3 shows an exemplary design of receiver 330 and transmitter 350. A receiver and a transmitter may also include other circuits not shown in FIG. 3, such as filters, matching circuits, etc. All or a portion of transceivers 320 and 322 may be implemented on one or more analog integrated circuits (ICs), RF ICs (RFICs), mixed-signal ICs, etc. For example, LNAs 340, and receive circuits 342 and may be implemented on one module, which may be an RFIC, etc. The circuits in transceivers 320 and 322 may also be implemented in other manners.

Data processor/controller 380 may perform various functions for wireless device 110. For example, data processor 380 may perform processing for data being received via receivers 330 and data being transmitted via transmitters 350. Controller 380 may control the operation of the various circuits within transceivers 320 and 322. A memory 382 may store program codes and data for data processor/controller 380. Data processor/controller 380 may be implemented on one or more application specific integrated circuits (ASICs) and/or other ICs.

Wireless device 110 may include one or more SIMO LNAs. A SIMO LNA includes a single input and multiple (M) outputs and can receive a single input RF signal at its input and provide up to M output RF signals from up to M outputs. A SIMO LNA may be used to simultaneously receive (i) multiple transmissions sent on multiple carriers in the same band for intra-band CA or (ii) multiple transmitted signals from different wireless systems (e.g., LTE and WCDMA).

Figure 4:
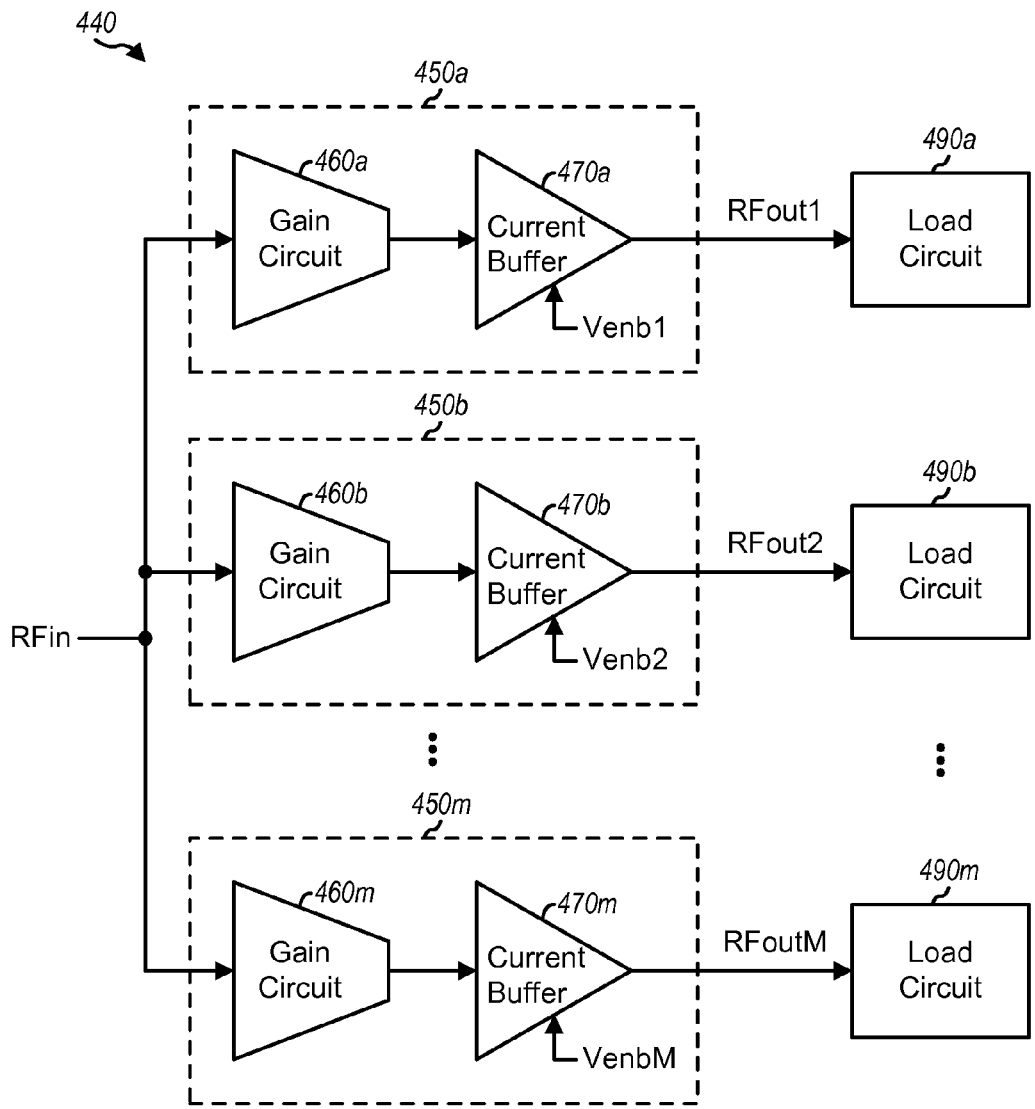
FIG. 4 shows a single-input multiple-output (SIMO) low noise amplifier (LNA) without noise splitting.

FIG. 4 shows a block diagram of an exemplary design of a SIMO LNA 440 without noise splitting. SIMO LNA 440 includes multiple (M) amplifier circuits 450a to 450m coupled to M load circuits 490a to 490m, respectively. The inputs of all M amplifier circuits 450a to 450m are coupled together. Each amplifier circuit 450 includes a gain circuit 460 coupled to a current buffer 470. Each amplifier circuit 450 may be enabled by turning on its current buffer 470 via a respective Venb control signal.

An input RF signal (RFin) is applied to the M amplifier circuits 450a to 450m. One or more amplifier circuits 450 may be enabled by turning on the associated current buffers 470. For example, N amplifier circuits 450 may be enabled to concurrently receive transmissions on N sets of carriers in the same band for intra-band CA, where 1≤N≤M. Each set of carriers may include one or more carriers. Each enabled amplifier circuit 450 may amplify the input RF signal and provides an output RF signal to its load circuit 490.

The N enabled amplifier circuits 450 in SIMO LNA 440 operate independently and have outputs that are separated from each other in order to provide isolation between different transmissions or signals being processed. Each gain circuit 460 outputs a signal current of $i_s$ and a noise current of $i_n$. The noise figure (NF) of each amplifier circuit 450 is dependent on the signal current and the noise current from the associated gain circuit 460. Amplifier circuits 450 typically have worse noise figure when operating simultaneously as compare to one amplifier circuit 450 operating alone due to degradation of input matching or noise coupling between different amplifier circuits.

In an aspect of the present disclosure, a SIMO LNA with noise splitting may be used to support simultaneous reception of multiple transmissions or signals. Noise splitting refers to "splitting" of noise among multiple outputs such that each output observes less noise and can achieve a better/lower noise figure.

Figure 5:
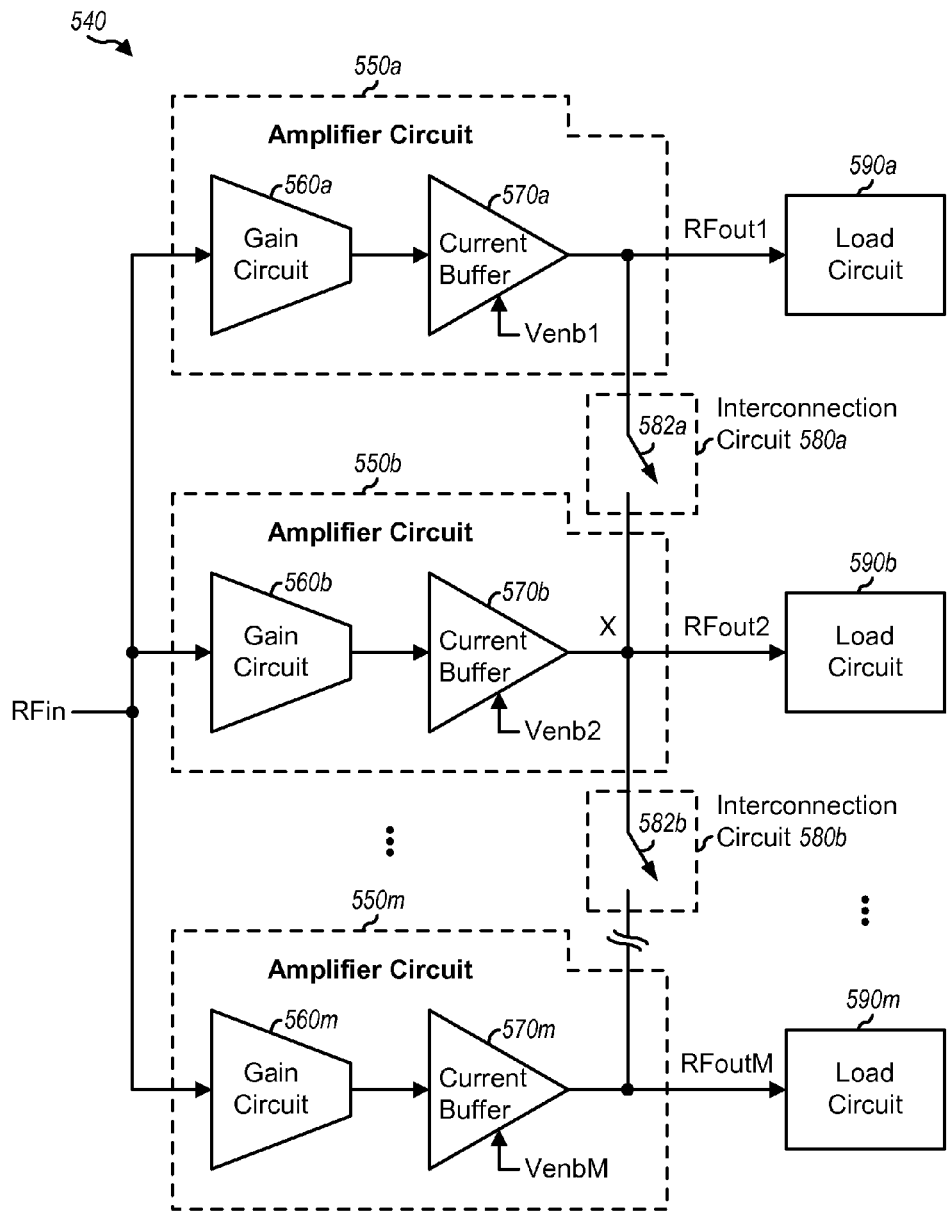
FIG. 5 shows a SIMO LNA with noise splitting at current buffer output.

FIG. 5 shows a block diagram of an exemplary design of a SIMO LNA 540 with noise splitting at current buffer output. SIMO LNA 540 may be used for one or more LNAs 340 in FIG. 3. SIMO LNA 540 includes multiple (M) amplifier circuits 550a to 550m coupled to M load circuits 590a to 590m, respectively. Each amplifier circuit 550 includes a gain circuit 560 coupled to a current buffer 570. Each amplifier circuit 550 may be enabled by turning on its current buffer 570 via a respective Venb control signal.

In the exemplary design shown in FIG. 5, SIMO LNA 540 further includes interconnection circuits 580 coupled between the outputs of amplifier circuits 550. Each interconnection circuit 580 may be implemented with a switch 582 (as shown in FIG. 5) or with some other circuit. Each switch 582 may be (i) opened to isolate the two amplifier circuits 550 coupled to the switch or (ii) closed to connect the outputs of the two amplifier circuits 550 and sum the output currents from these amplifier circuits.

In general, any number of amplifier circuits 550 and any one of amplifier circuits 550 may be enabled at any given moment. Furthermore, any number of switches 582 and any one of switches 582 may be closed at any given moment. A given amplifier circuit 550 may drive its load circuit 590 by itself. Alternatively, multiple amplifier circuits 550 may have their outputs coupled together via their closed switches 582 and may collectively drive their load circuits 590. The noise figures of amplifier circuits 550 having their outputs coupled together may be improved through noise splitting.

If all switches 582 are opened, then each amplifier circuit 550 may drive only its load circuit 590. The output current provided by each amplifier circuit 550 to its load circuit 590 may be expressed as:

$$i_m = i_{s,m} + i_{n,m} \qquad \text{Eq (1)}$$

where $i_{s,m}$ is a signal current from the m-th amplifier circuit 550,
$i_{n,m}$ is a noise current from the m-th amplifier circuit 550, and
$i_m$ is an output current from the m-th amplifier circuit 550.

The noise power at each load circuit 590 may be expressed as:

$$P_{noise,m} \approx i_{n,m}^2 * R_{load} \qquad \text{Eq (2)}$$

where $R_{load}$ is an impedance of each load circuit 590, and
$P_{noise,m}$ is the noise power at the m-th load circuit 590 without noise splitting.

If all switches 582 are closed, then the outputs of all M amplifier circuits 550a to 550m are shorted together at a summing node X. In this case, the total current $i_{total}$ at the summing node may be expressed as:

$$i_{total} = (i_{s,1} + i_{n,1}) + (i_{s,2} + i_{n,2}) + \ldots + (i_{s,M} + i_{n,M}) \qquad \text{Eq (3)}$$

$$\approx M * i_s + (i_{n,1} + i_{n,2} + \ldots + i_{n,M})$$

where $i_s$ is an average signal current from each amplifier circuit 550, and
$i_{total}$ is a total current from all M amplifier circuits 550a to 550m.

The signal currents $i_{s,1}$ to $i_{s,M}$ from the M amplifier circuits 550a to 550m (or more specifically, from M gain circuits 560a to 560m) should be similar since they are generated based on the same input RF signal, which is applied to all M amplifier circuits 550. Hence, the total signal current may be approximately equal to $M*i_s$. The noise currents $i_{n,1}$ to $i_{n,M}$ from the M amplifier circuits 550a to 550m should be uncorrelated. Hence, the total noise current is equal to the sum of the noise currents from the M amplifier circuits 550a to 550m.

The total current at the summing node may be split and provided to the M load circuits 590a to 590m. The current received by each load circuit 590 may be expressed as:

$$i_{load} = \frac{i_{total}}{M} \approx i_d + \frac{(i_{n,1} + i_{n,2} + \ldots + i_{n,M})}{M}, \qquad \text{Eq (4)}$$

where $i_{load}$ is a load current provided to each load circuit 590.

The noise currents from the M amplifier circuits 550a to 550m should be uncorrelated and may add constructively or destructively. Hence, the noise power at each load circuit 590 may be expressed as:

$$P_{noise} \approx \frac{i_n^2 * R_{load}}{M}, \qquad \text{Eq (5)}$$

where $i_n$ is an average noise current from each amplifier circuit 570, and
$P_{noise}$ is the noise power at each load circuit 590 with noise splitting.

As shown in equations (2) and (5), noise splitting may reduce the noise power at each load circuit 590 by a factor of M, which corresponds to the number of amplifier circuits 550 having their outputs shorted together. The reduction in noise power is due to the noise currents from the M amplifier circuits 550a to 550m being uncorrelated. The signal power at each load circuit 590 may be approximately the same regardless of whether or not the outputs of amplifier circuits 550 are shorted together. The constant signal power with or without noise splitting is due to the signal currents from the M amplifier circuits 550a to 550m being similar or highly correlated. The noise figure at each load circuit 590 may be improved with noise splitting since the signal power is approximately the same whereas the noise power is reduced by a factor of M with noise splitting.

SIMO LNA 540 with noise splitting at current buffer output may be implemented with various circuit architectures. Some exemplary designs of SIMO LNA 540 are described below. SIMO LNA 540 may also be implemented with transistors of various types. Some exemplary designs of SIMO LNA 540 implemented with N-channel metal oxide semiconductor (NMOS) transistors are described below.

Figure 6A:
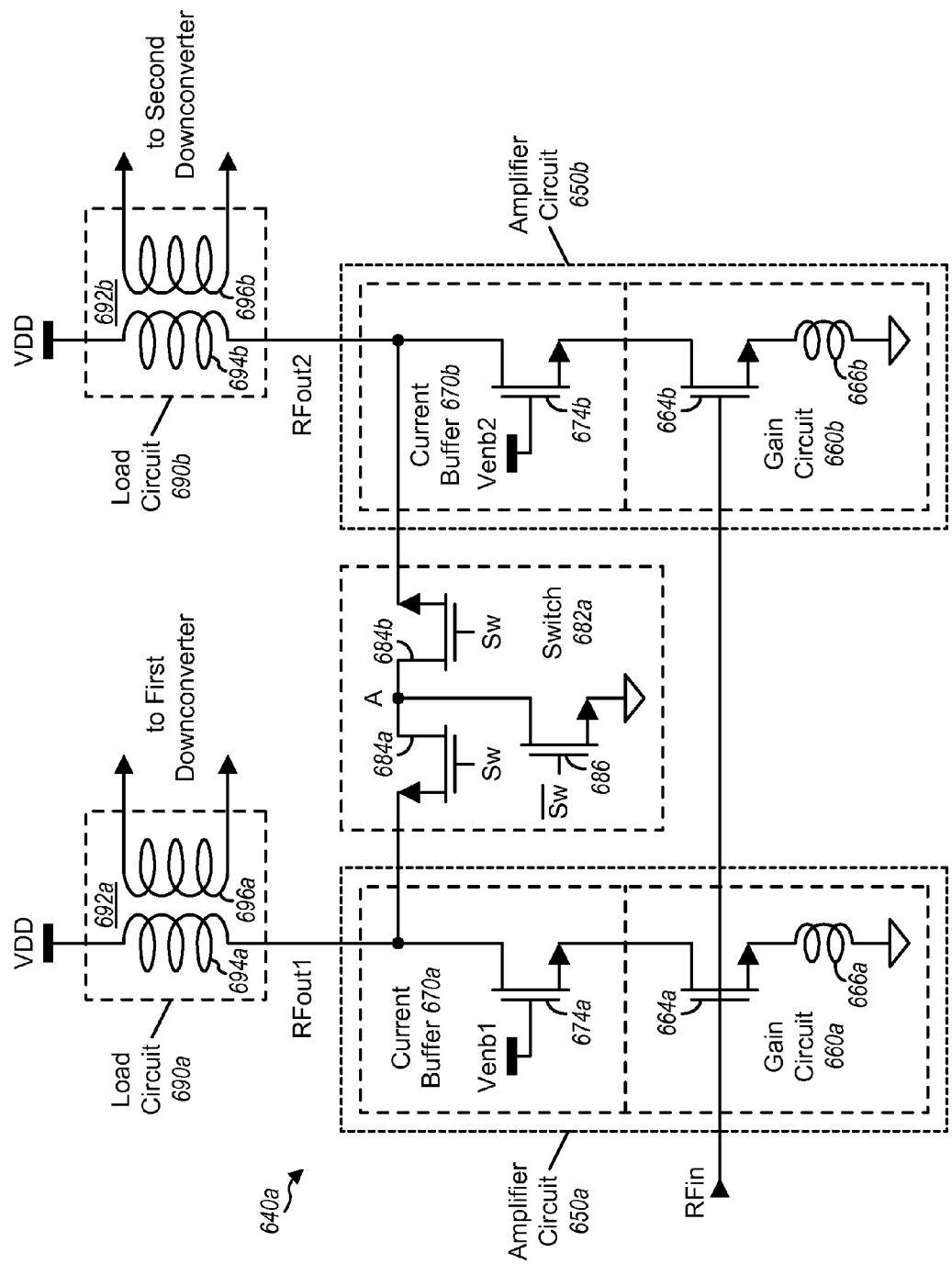
FIGS. 6A to 7C show some exemplary designs of the SIMO LNA with noise splitting at current buffer output.

FIG. 6A shows a schematic diagram of an exemplary design of a SIMO LNA 640a with separate inductive degeneration and noise splitting at current buffer output. SIMO LNA 640a is one exemplary design of SIMO LNA 540 in FIG. 5. SIMO LNA 640a includes two amplifier circuits 650a and 650b and a switch 682a. Each amplifier circuit 650 includes a gain circuit 660 and a current buffer 670. SIMO LNA 640a receives an input RF signal, which is applied to both amplifier circuits 650a and 650b. The input RF signal may include transmissions on one or two sets of carriers for carrier aggregation, with each set including one or more carriers. Alternatively, the input RF signal may include two transmitted signals (e.g., from two wireless systems) to be received simultaneously.

In the exemplary design shown in FIG. 6A, each gain circuit 660 includes a gain transistor 664 and a source degeneration inductor 666. Within gain circuit 660a, gain transistor 664a has its gate receiving the input RF signal, its source coupled to one end of inductor 666a, and its drain forming an output of gain circuit 660a. The other end of inductor 666a is coupled to circuit ground. In the exemplary design shown in FIG. 6A, each current buffer 670 includes a cascode transistor 674. Within current buffer 670a, cascode transistor 674a has its source forming an input of current buffer 670a and being coupled to the drain of gain transistor 664a, its gate receiving a Venb1 control signal, and its drain forming an output of current buffer 670a and being coupled to a load circuit 690a. Amplifier circuit 650b includes gain transistor 664b, source degeneration inductor 666b, and cascode transistor 674b, which are coupled in similar manner as gain transistor 664a, inductor 666a, and cascode transistor 674a in amplifier circuit 650a. Gain transistors 664 and cascode transistors 674 may be implemented with NMOS transistors, as shown in FIG. 6A, or with transistors of other types.

In the exemplary design shown in FIG. 6A, switch 682a includes NMOS transistors 684a, 684b and 686. NMOS transistor 684a has its drain coupled to node A, its gate receiving a Sw control signal, and its source coupled to the drain of cascode transistor 674a, which is the output of current buffer 670a. NMOS transistor 684b has its drain coupled to node A, its gate receiving the Sw control signal, and its source coupled to the drain of cascode transistor 674b, which is the output of current buffer 670b. NMOS transistor 686 has its drain coupled to node A, its gate receiving a $\overline{Sw}$ control signal, and its source coupled to circuit ground. The $\overline{Sw}$ signal is complementary to the Sw signal. Switch 682a does not need to have a low resistance when it is closed. In particular, the on resistance of switch 682a should be low compared to the impedance of load circuit 690. Switch 682a may be closed by (i) turning on NMOS transistors 684a and 684b with a high voltage on the Sw signal and (ii) turning off NMOS transistor 686 with a low voltage on the $\overline{Sw}$ signal. Conversely, switch 682a may be opened by (i) turning off NMOS transistors 684a and 684b with a low voltage on the Sw signal and (ii) turning on NMOS transistor 686 with a high voltage on the $\overline{Sw}$ signal.

Amplifier circuits 650a and 650b may also be implemented in other manners. In another exemplary design, an amplifier circuit may include a gain transistor having its source coupled directly to circuit ground (instead of to a source degeneration inductor). In yet another exemplary design, an amplifier circuit may include two gain transistors coupled in parallel and having their gates receiving the input RF signal. A first gain transistor may have its source coupled to a source degeneration inductor, as shown in FIG. 6A. A second gain transistor may have its source coupled directly to circuit ground. Either the first or second gain transistor may be selected depending on the received power of the input RF signal.

In the exemplary design shown in FIG. 6A, each load circuit 690 includes a transformer 692 comprising a primary coil 694 and a secondary coil 696. A coil may also be referred to as an inductor coil, a winding, a conductor, etc. Within load circuit 690a, a transformer 692a includes (i) a primary coil 694a coupled between the output of amplifier circuit 650a and a power supply (VDD) and (ii) a secondary coil 696a providing a first differential amplified RF signal to a first downconverter (not shown in FIG. 6A). Load circuit 690b includes a transformer 692b having (i) a primary coil 694b coupled between the output of amplifier circuit 650b and the VDD supply and (ii) a secondary coil 696b providing a second differential amplified RF signal to a second downconverter (not shown in FIG. 6A). Each downconverter may include two mixers to perform quadrature downconversion of an amplified RF signal from RF to baseband or an intermediate frequency.

Load circuits 690 may also be implemented in other manners. In another exemplary design, a load circuit may include an inductor and possibly a capacitor coupled between the output of an amplifier circuit and the VDD supply. In yet another exemplary design, a load circuit may include a P-channel metal oxide semiconductor (PMOS) transistor having its source coupled to the VDD supply and its drain coupled to the drain of a cascode transistor 674. The PMOS transistor may provide an active load for cascode transistor 674.

For simplicity, FIG. 6A shows SIMO LNA 640a including two amplifier circuits 650a and 650b, which are coupled to two load circuits 690a and 690b. SIMO LNA 640a may include more than two amplifier circuits 650 coupled to more than two load circuits 690.

SIMO LNA 640a may operate in a single-output mode or a multi-output mode. In the single-output mode, SIMO LNA 640a receives the input RF signal and provides one output RF signal to one load circuit 690. The single-output mode may be used to receive (i) a transmission on one carrier without carrier aggregation, or (ii) transmissions on one set of carriers among transmissions on multiple sets of carriers in different bands for inter-band CA, or (iii) a transmitted signal from one wireless system. In the multi-output mode, SIMO LNA 640a receives the input RF signal and provides two output RF signals to two load circuits 690. The multi-output mode may be used to receive (i) transmissions on two sets of carriers for intra-band CA or (ii) two transmitted signals from two wireless systems.

Figure 6B:
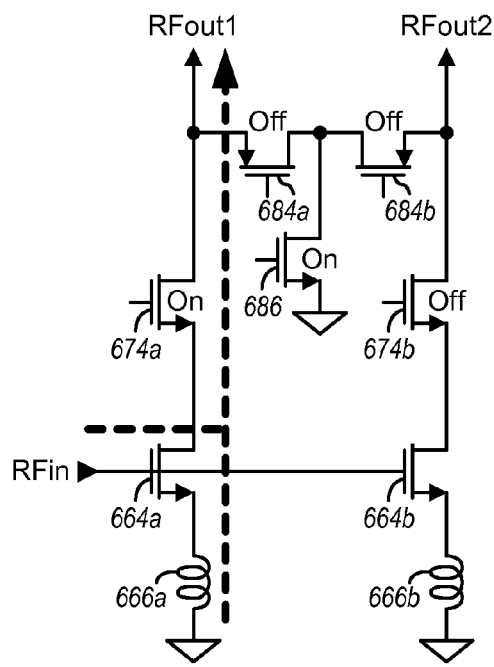

FIG. 6B shows operation of SIMO LNA 640a in the single-output mode with RFout1 enabled. In this case, cascode transistor 674a is turned on and cascode transistor 674b is turned off. Furthermore, switch 682a is opened by turning off transistors 684a and 684b and turning on transistor 686. Amplifier circuit 650a amplifies the input RF signal and provides a first output RF signal (RFout1). Amplifier circuit 650a is isolated from amplifier circuit 650b via the opened switch 682a.

Figure 6C:
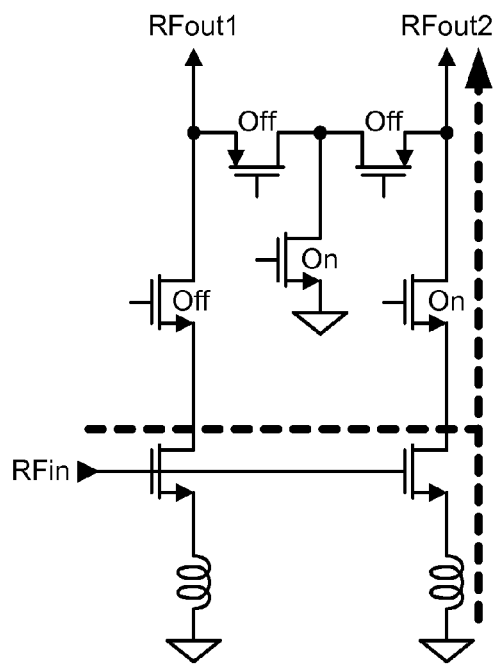

FIG. 6C shows operation of SIMO LNA 640a in the single-output mode with RFout2 enabled. In this case, cascode transistor 674b is turned on, cascode transistor 674a is turned off, and switch 682a is opened. Amplifier circuit 650b amplifies the input RF signal and provides a second output RF signal (RFout2). Amplifier circuit 650b is isolated from amplifier circuit 650a via the opened switch 682a.

Figure 6D:
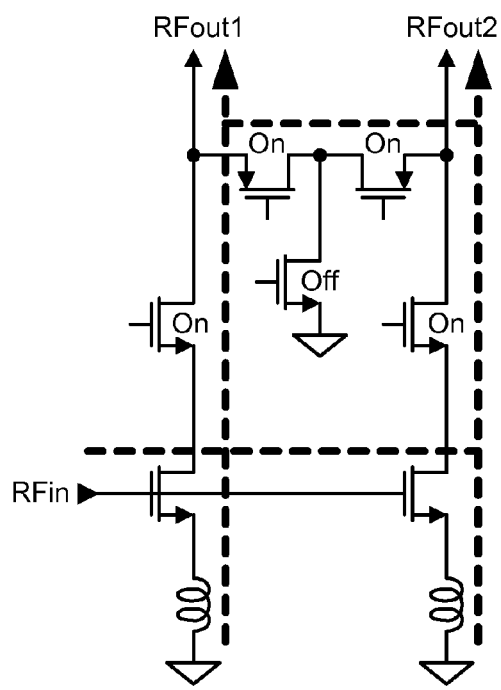

FIG. 6D shows operation of SIMO LNA 640a in the multi-output mode. In this case, cascode transistors 674a and 674b are both turned on. Furthermore, switch 682a is closed by turning on transistors 684a and 684b and turning off transistor 686. Amplifier circuits 650a and 650b amplify the input RF signal, and their output currents are summed Approximately half of the total current is provided as the RFout1 signal. The remaining current is provided as the RFout2 signal.

Figure 7A:
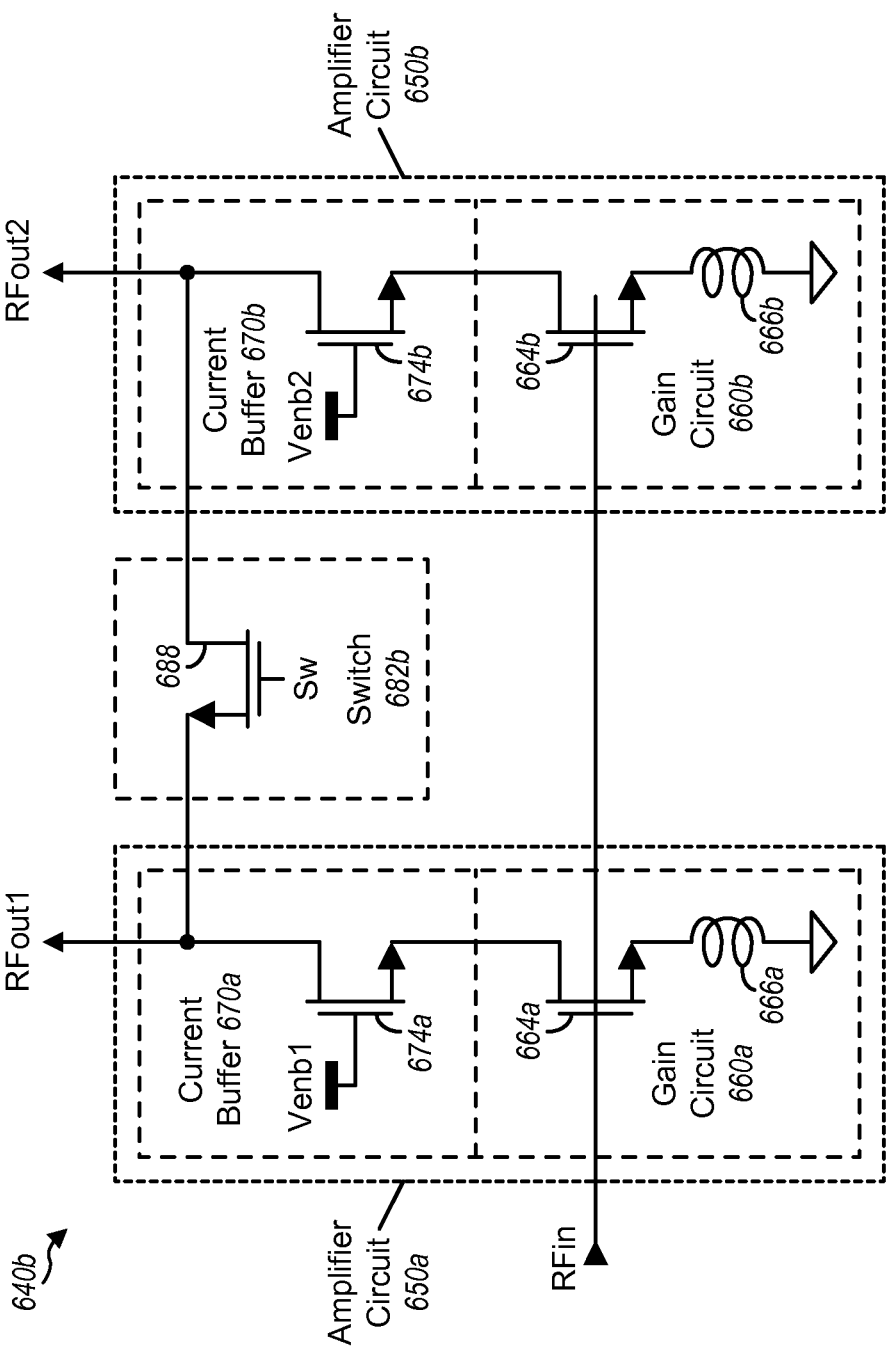

FIG. 7A shows a schematic diagram of an exemplary design of a SIMO LNA 640b with separate inductive degeneration and noise splitting at current buffer output. SIMO LNA 640b is another exemplary design of SIMO LNA 540 in FIG. 5. SIMO LNA 640b includes two amplifier circuits 650a and 650b and a switch 682b. Each amplifier circuit 650 includes (i) gain circuit 660 comprising gain transistor 664 and source degeneration inductor 666 and (ii) current buffer 670 comprising cascode transistor 674. Switch 682b includes an NMOS transistor 688 having its source coupled to the output of amplifier circuit 650a, its gate receiving a Sw control signal, and its drain coupled to the output of amplifier circuit 650b. A MOS transistor (e.g., NMOS transistor 688) may be implemented with a symmetric structure, and the source and drain of the MOS transistor may be interchangeable. SIMO LNA 640b may operate in the single-output mode or the multi-output mode, as described above for FIGS. 6B to 6D.

FIGS. 6A and 7A show two exemplary designs of a switch that may be used to short the outputs of two amplifier circuits. A switch may also be implemented in other manners. In another exemplary design, a capacitor and/or a resistor may be coupled in series with one or more MOS transistors, and the series combination may be coupled between the outputs of two amplifier circuits. The capacitor and/or resistor may improve isolation with a tradeoff in noise figure.

Figure 7B:
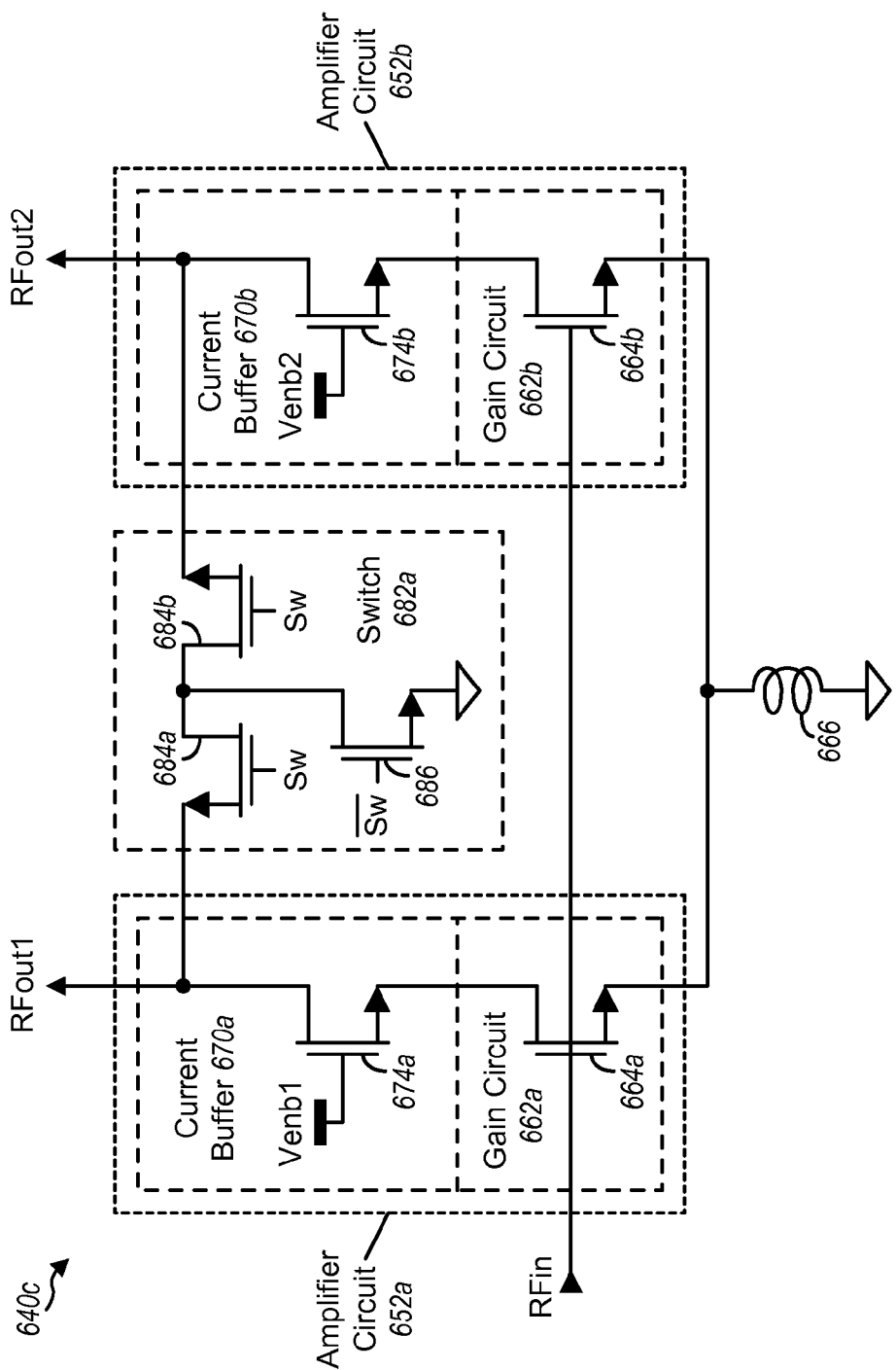

FIG. 7B shows a schematic diagram of an exemplary design of a SIMO LNA 640c with shared inductive degeneration and noise splitting at current buffer output. SIMO LNA 640c is yet another exemplary design of SIMO LNA 540 in FIG. 5. SIMO LNA 640c includes two amplifier circuits 652a and 652b and switch 682a. Each amplifier circuit 652 includes (i) a gain circuit 662 comprising gain transistor 664 and (ii) current buffer 670 comprising cascode transistor 674. Gain transistors 664a and 664b in gain circuits 662a and 662b share a source degeneration inductor 666 having one end coupled to the sources of gain transistors 664a and 664b and the other end coupled to circuit ground. SIMO LNA 640c may operate in the single-output mode or the multi-output mode, as described above for FIGS. 6B to 6D.

Figure 7C:
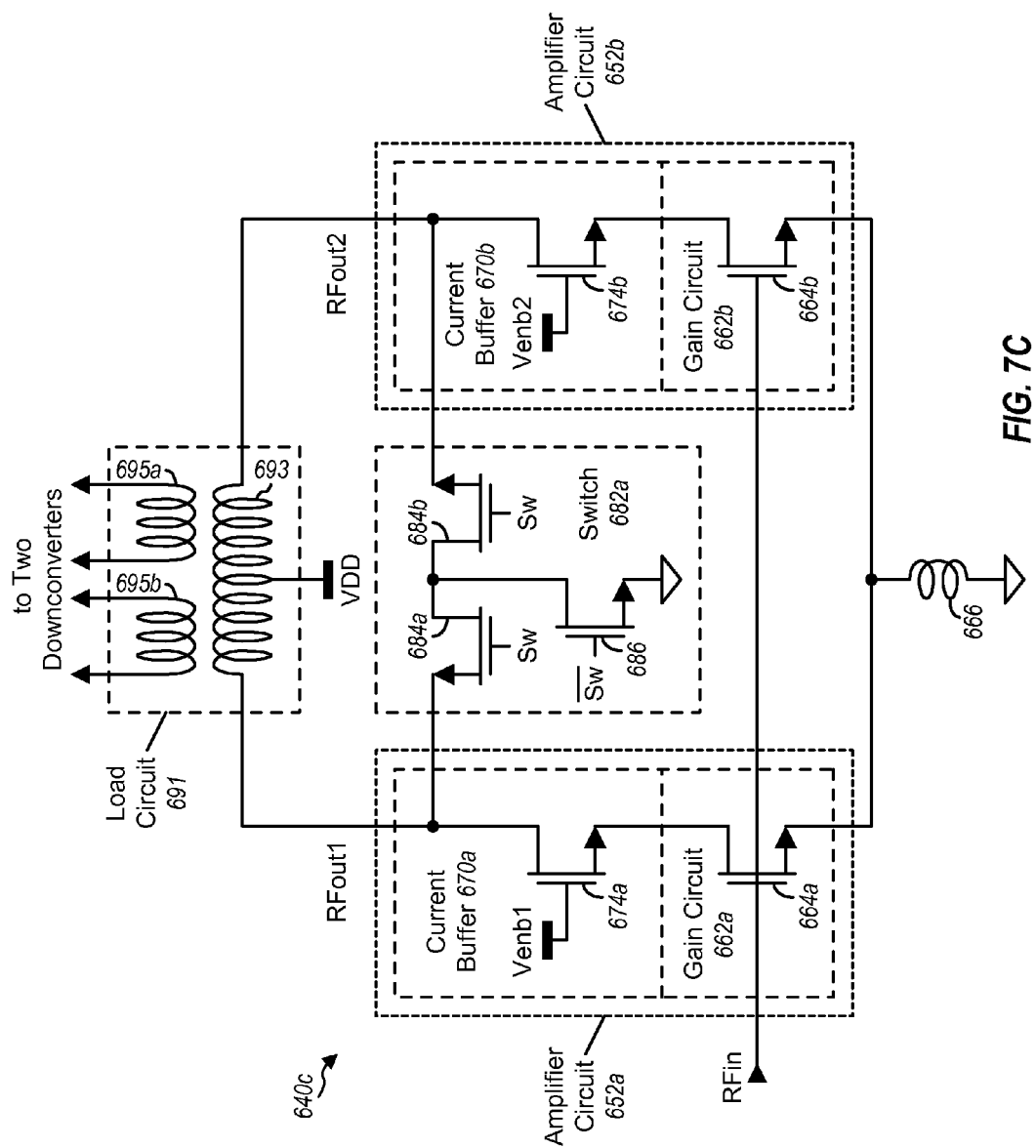

FIG. 7C shows a schematic diagram of an exemplary design of SIMO LNA 640c with noise splitting at current buffer output and a load circuit 691 with transformer-based signal splitting. SIMO LNA 640c includes two amplifier circuits 652a and 652b sharing source degeneration inductor 666 as well as switch 682a, which are coupled as described in FIG. 7B. Load circuit 691 is coupled to amplifier circuits 652a and 652b. In the exemplary design shown in FIG. 7C, load circuit 691 comprises a transformer having a primary coil 693 and two secondary coils 695a and 695b. Primary coil 693 has one end coupled to the output of amplifier circuit 652a, the other end coupled to the output of amplifier circuit 652b, and a center tap coupled to the VDD supply. Secondary coils 695a and 695b are magnetically coupled to primary coil 693. Secondary coil 695a provides a first differential amplified RF signal to a first downconverter. Secondary coil 695b provides a second differential amplified RF signal to a second downconverter. In an exemplary design, secondary coils 695a and 695b may be symmetric with respect to each other.

Figure 8:
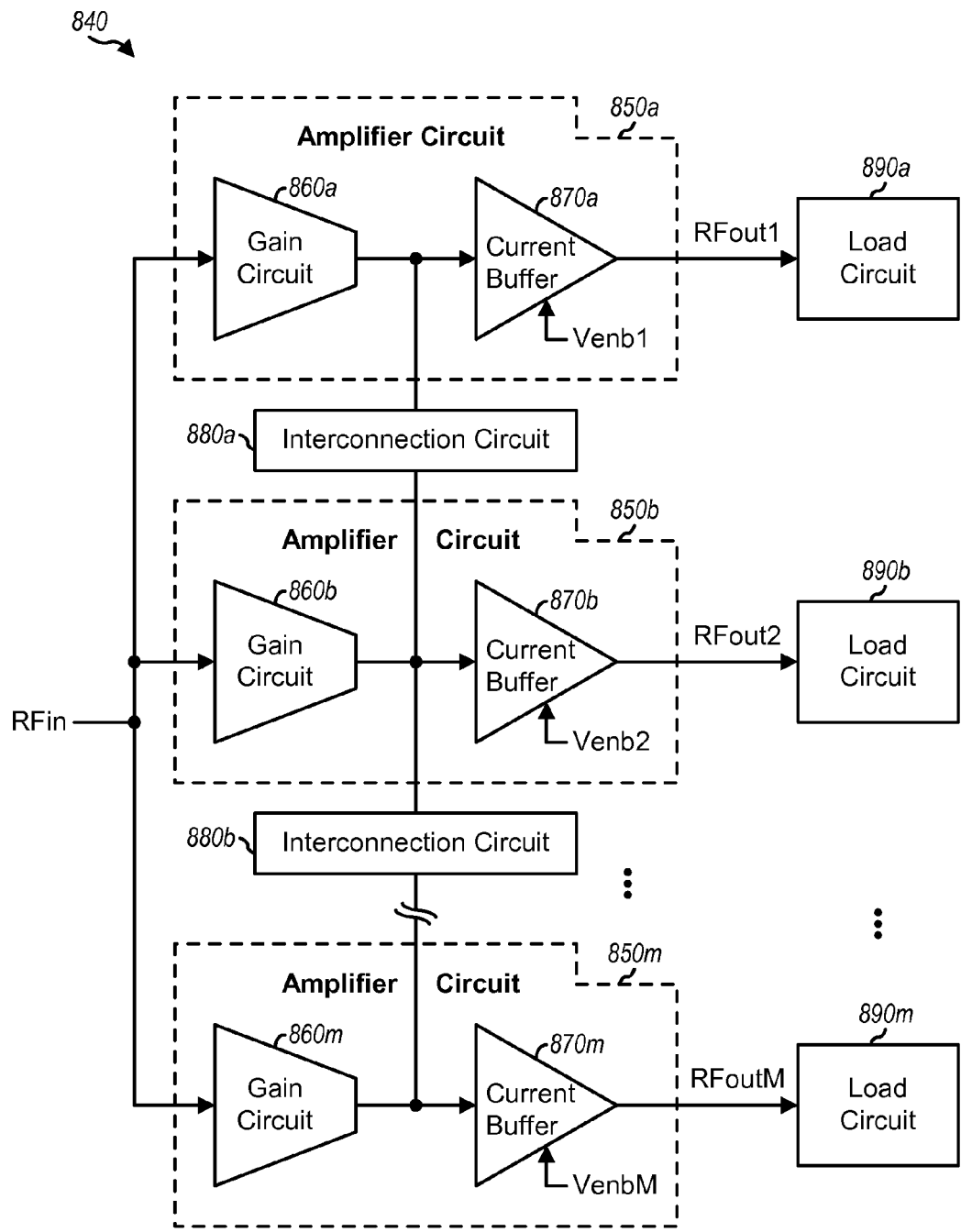
FIG. 8 shows a SIMO LNA with noise splitting at gain circuit output.

FIG. 8 shows a block diagram of an exemplary design of a SIMO LNA 840 with noise splitting at gain circuit output. SIMO LNA 840 may be used for one or more LNAs 340 in FIG. 3. SIMO LNA 840 includes multiple (M) amplifier circuits 850a to 850m, which are coupled to M load circuits 890a to 890m, respectively. Each amplifier circuit 850 includes a gain circuit 860 coupled to a current buffer 870. Each amplifier circuit 850 may be enabled by turning on its current buffer 870 via a respective Venb control signal.

In the exemplary design shown in FIG. 8, SIMO LNA 840 further includes interconnection circuits 880 between the outputs of gain circuits 860. Interconnection circuits 880 allow the output currents from all enabled gain circuits 860 to be summed together. The total current from all enabled gain circuits 860 may then be split among current buffers 870 of all enabled amplifier circuits 850. Interconnection circuits 880 may be implemented in various manners as described below.

SIMO LNA 840 with noise splitting at gain circuit output may be implemented with various circuit architectures and various types of transistors. Some exemplary designs of SIMO LNA 840 implemented with NMOS transistors are described below.

Figure 9A:
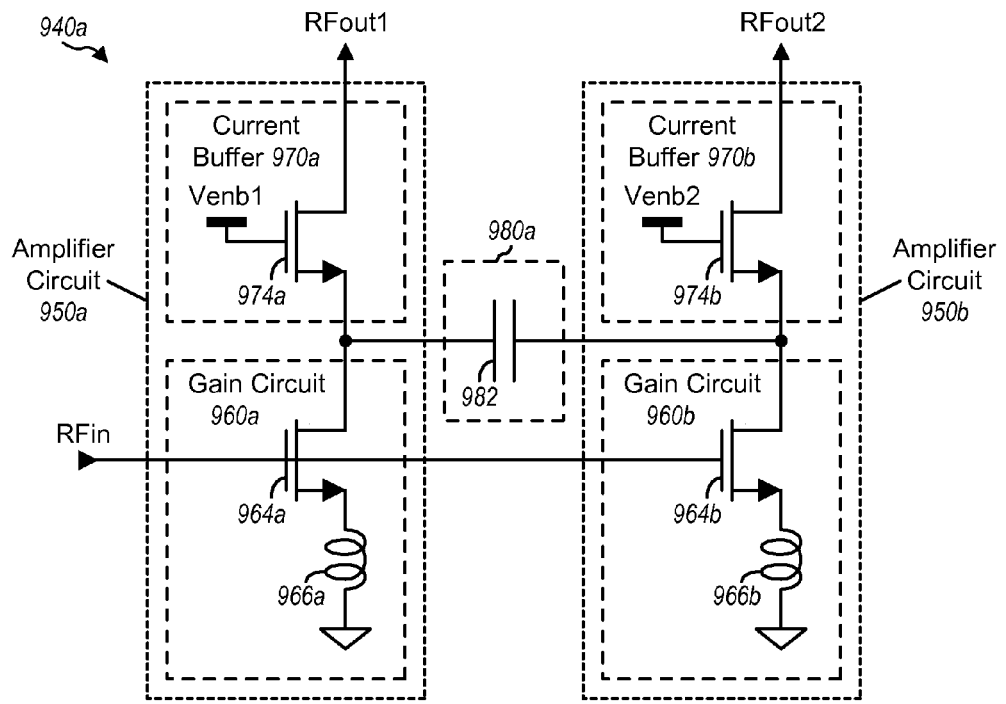
FIGS. 9A to 9C show some exemplary designs of the SIMO LNA with noise splitting at gain circuit output.

FIG. 9A shows a schematic diagram of an exemplary design of a SIMO LNA 940a with separate inductive degeneration and noise splitting at gain circuit output. SIMO LNA 940a is one exemplary design of SIMO LNA 840 in FIG. 8. SIMO LNA 940a includes two amplifier circuits 950a and 950b and an interconnection circuit 980a, which is implemented with an AC coupling capacitor 982. Each amplifier circuit 950 includes (i) a gain circuit 960 comprising a gain transistor 964 and a source degeneration inductor 966 and (ii) a current buffer 970 comprising a cascode transistor 974. Capacitor 982 is coupled between the outputs of gain circuits 960a and 960b and acts to electrically short the outputs of gain circuits 960a and 960b. Since current buffers 970a and 970b can provide isolation, the outputs of gain circuits 960 may be effectively shorted together via capacitor 982 without the need to use switches. SIMO LNA 940a receives an input RF signal, which is applied to both amplifier circuits 950a and 950b. Amplifier circuits 950a and 950b provide two output RF signals RFout1 and RFout2, respectively.

FIG. 9A shows an exemplary design in which interconnection circuit 980a is implemented with capacitor 982. Capacitor 982 should be sufficiently large so that its impedance is small in comparison to the transconductance (or $1/g_m$) of cascode transistors 974. An interconnection circuit may also be implemented in other manners with other circuits.

SIMO LNA 940a may operate in a single-output mode or a multi-output mode. In the single-output mode, SIMO LNA 940a receives the input RF signal and provides one output RF signal, which may be either RFout1 or RFout2. In the multi-output mode, SIMO LNA 940a receives the input RF signal and provides two output RF signals RFout1 and RFout2.

Figure 9B:
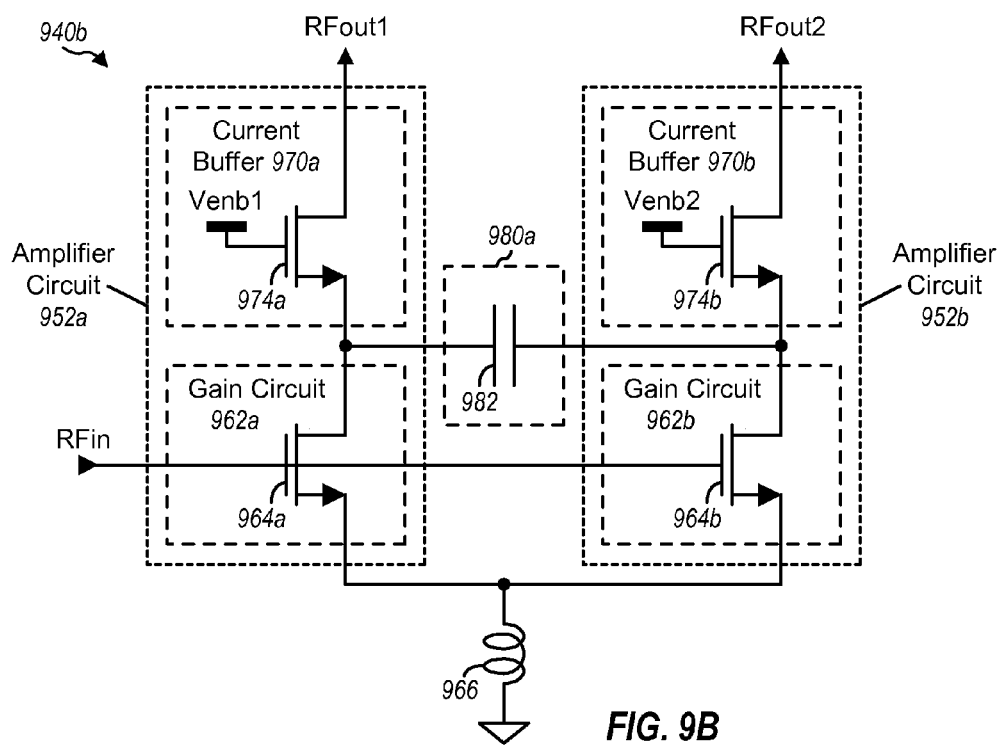

FIG. 9B shows a schematic diagram of an exemplary design of a SIMO LNA 940b with shared inductive degeneration and noise splitting at gain circuit output. SIMO LNA 940b is another exemplary design of SIMO LNA 840 in FIG. 8. SIMO LNA 940b includes two amplifier circuits 952a and 952b and interconnection circuit 980a. Each amplifier circuit 952 includes (i) a gain circuit 962 comprising gain transistor 964 and (ii) a current buffer 970 comprising cascode transistor 974. Gain transistors 964a and 964b in gain circuits 962a and 962b share a source degeneration inductor 966 having one end coupled to the sources of gain transistors 964a and 964b and the other end coupled to circuit ground. SIMO LNA 940b may operate in the single-output mode or the multi-output mode.

Figure 9C:
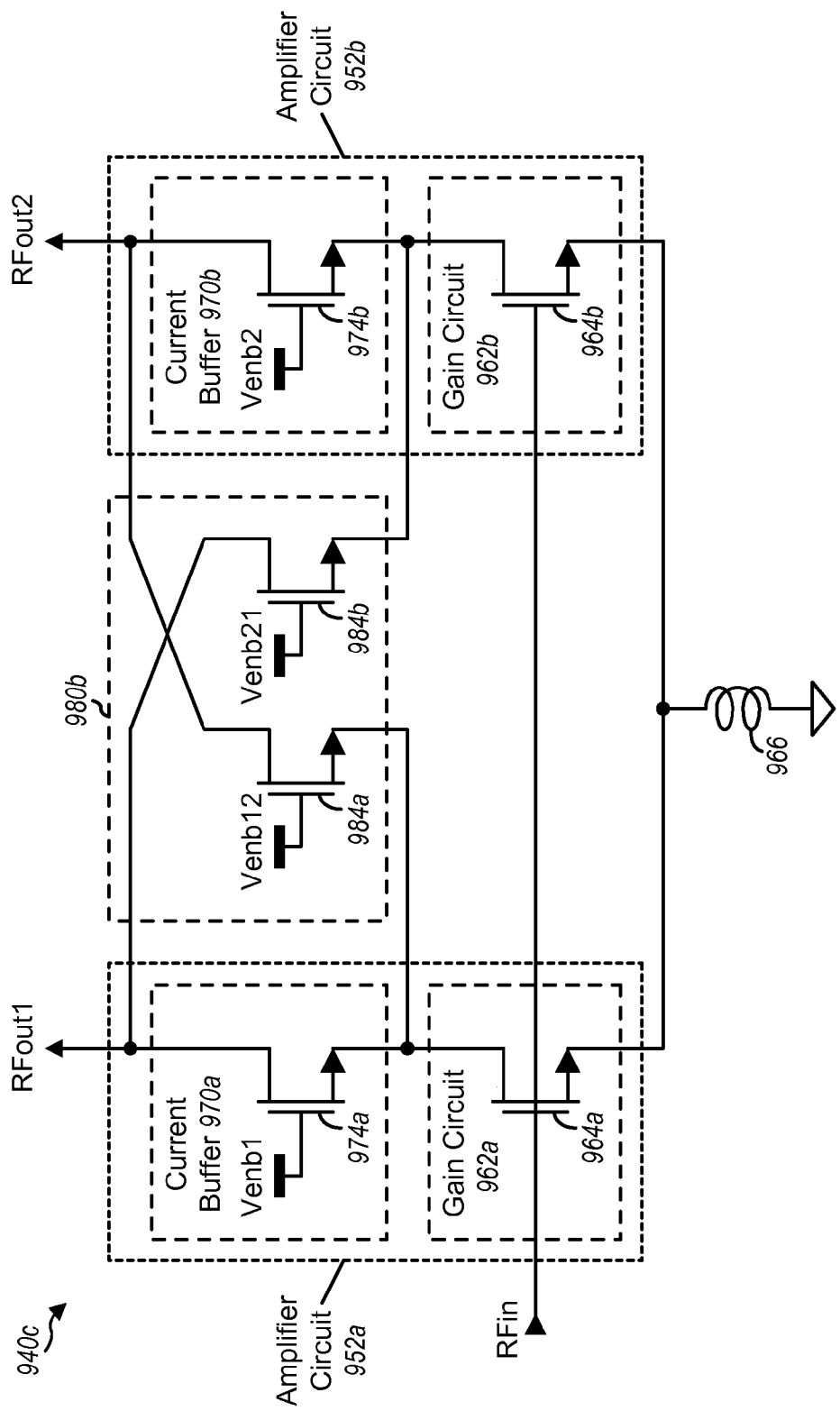

FIG. 9C shows a schematic diagram of an exemplary design of a SIMO LNA 940c with shared inductive degeneration and noise splitting at gain circuit output. SIMO LNA 940c is yet another exemplary design of SIMO LNA 840 in FIG. 8. SIMO LNA 940c includes two amplifier circuits 952a and 952b, source degeneration inductor 966, and an interconnection circuit 980b. Interconnection circuit 980b includes two cross-coupled cascode transistors 984a and 984b. Cascode transistor 984a has its source coupled to the drain of gain transistor 964a, its gate receiving a Venb12 control signal, and its drain coupled to the output of amplifier circuit 952b. Cascode transistor 984b has its source coupled to the drain of gain transistor 964b, its gate receiving a Venb21 control signal, and its drain coupled to the output of amplifier circuit 952a.

SIMO LNA 940c may operate in the single-output mode or the multi-output mode. In the single-output mode with RFout1 enabled, amplifier circuit 952a may be enabled, amplifier circuit 952b may be disabled, NMOS transistors 984a and 984b may be turned off, and amplifier circuit 952a may provide the RFout1 signal. Alternatively, amplifier circuit 952a may be enabled, gain transistor 964b and cascode transistor 984b may be enabled, cascode transistors 974b and 984a may be disabled, and amplifier circuit 952a may provide the RFout1 signal.

In the single-output mode with RFout2 enabled, amplifier circuit 952b may be enabled, amplifier circuit 952a may be disabled, NMOS transistors 984a and 984b may be turned off, and amplifier circuit 952b may provide the RFout2 signal. Alternatively, amplifier circuit 952b may be enabled, gain transistor 964a and cascode transistor 984a may be enabled, cascode transistors 974a and 984b may be disabled, and amplifier circuit 952b may provide the RFout2 signal.

In the multi-output mode, amplifier circuits 952a and 952b may both be enabled, NMOS transistors 984a and 984b may be enabled, and amplifier circuits 952a and 952b may provide the RFout1 and RFout2 signals, respectively. In the multi-output mode, gain circuit 962a may provide half its output current to cascode transistor 974a and the other half of its output current to cascode transistor 984a. Similarly, gain circuit 962b may provide half its output current to cascode transistor 974b and the other half of its output current to cascode transistor 984b. The currents from cascode transistors 974a and 984b may be summed at the output of amplifier circuit 952a. The currents from cascode transistors 974b and 984a may be summed at the output of amplifier circuit 952b. Cascode transistors 984a and 984b effectively short the drains of gain transistors 964a and 964b together while presenting low impedance to gain transistors 964a and 964b. The noise figures of amplifier circuits 952a and 952b may be improved through noise splitting obtained by turning on cascode transistors 984a and 984b and splitting the output currents of gain transistors 964a and 964b in the multi-output mode.

FIGS. 9A and 9C show two exemplary designs of interconnection circuit 980 between gain circuits 960. An interconnection circuit between gain circuits may also be implemented in other manners. In another exemplary design, an interconnection circuit may be implemented with an NMOS transistor, which may be coupled as shown for NMOS transistor 688 in FIG. 7A. In yet another exemplary design, an interconnection circuit may be implemented with two series NMOS transistors and a shunt NMOS transistor, which may be coupled as shown for series NMOS transistors 684a and 684b and shunt NMOS transistor 686 in FIG. 6A. An interconnection circuit may be implemented in various manners and should have low impedance looking into the interconnection circuit.

FIGS. 6A to 9C shows several exemplary designs of an LNA comprising a gain transistor and a cascode transistor. In another exemplary design, an LNA may comprise a NMOS transistor and a P-channel metal oxide semiconductor (PMOS) transistor coupled in similar manner as an inverter. In yet another exemplary design, an LNA may comprise a differential pair. An LNA may also be implemented in other manners.

The SIMO LNAs with noise splitting described herein may be used for various applications. The SIMO LNAs may be used to receive transmissions on multiple carriers (e.g., in the same band) for carrier aggregation. The SIMO LNAs may also be used to concurrently receive transmitted signals (e.g., in the same band) from multiple wireless systems (e.g., LTE and GSM, EVDO and CDMA 1x, WLAN and Bluetooth, etc.). The SIMO LNAs may also be used to concurrently receive transmissions for different services (e.g., voice and data). The SIMO LNAs may provide a single output RF signal in the single-output mode or multiple output RF signals in the multi-output mode.

The SIMO LNAs with noise splitting described herein may provide various advantages. First, these SIMO LNAs may have better noise figure due to noise splitting without sacrificing other performance metrics such as linearity. Second, the SIMO LNAs may be implemented with little additional die area and no increase in current consumption. Third, noise splitting may be applied to any circuit with two or more amplifier circuits sharing the same input RF signal.

In an exemplary design, an apparatus (e.g., a wireless device, an IC, a circuit module, etc.) may include a plurality of amplifier circuits and at least one interconnection circuit. The plurality of amplifier circuits (e.g., amplifier circuits 550a to 550m in FIG. 5 or amplifier circuits 850a to 850m in FIG. 8) may have their inputs coupled together and may receive an input RF signal. The at least one interconnection circuit (e.g., interconnection circuits 580 in FIG. 5 or interconnection circuits 880 in FIG. 8) may short at least two of the plurality of amplifier circuits coupled to the at least one interconnection circuit. Each interconnection circuit may be closed to short the outputs or internal nodes of two amplifier circuits coupled to that interconnection circuit.

In an exemplary design, the plurality of amplifier circuits may comprise a plurality of gain circuits (e.g., gain circuits 560 in FIG. 5 or gain circuits 860 in FIG. 8) and a plurality of current buffers (e.g., current buffers 570 in FIG. 5 or current buffers 870 in FIG. 7). Each amplifier circuit may include one gain circuit coupled to one current buffer. In an exemplary design, each gain circuit may comprise a gain transistor that receives the input RF signal and provides an amplified signal when the gain circuit is enabled. In an exemplary design, each current buffer may comprise a cascode transistor that receives an amplified signal from an associated gain circuit and provides an output RF signal when the current buffer is enabled.

In an exemplary design, one of the plurality of amplifier circuits may amplify the input RF signal and provide one output RF signal when this one amplifier circuit is enabled. The remaining amplifier circuits may be disabled. In an exemplary design, the plurality of amplifier circuits may be enabled to amplify the input RF signal and provide a plurality of output RF signals. Each amplifier circuit may provide an output current comprising a portion of the current from each of the plurality of gain circuits when the plurality of amplifier circuits are enabled.

In an exemplary design, noise splitting at current buffer output may be implemented, e.g., as shown in FIG. 5. The at least one interconnection circuit may comprise at least one switch (e.g., switches 582 in FIG. 5) coupled between the outputs of the plurality of amplifier circuits. Each switch may be closed to short the outputs of two amplifier circuits coupled to that switch. The at least one interconnection circuit or switch may short the outputs of the plurality of amplifier circuits when the plurality of amplifier circuits are enabled.

In another exemplary design, noise splitting at gain circuit output may be implemented, e.g., as shown in FIG. 8. In an exemplary design, the at least one interconnection circuit may comprise at least one capacitor (e.g., capacitor 982 in FIG. 9A) coupled between the outputs of the plurality of gain circuits. Each capacitor may short the outputs of two gain circuits coupled to that capacitor. The at least one interconnection circuit may short the outputs of the plurality of gain circuits when the plurality of amplifier circuits are enabled. In another exemplary design, the at least one interconnection circuit may comprise a plurality of cascode transistors (e.g., cascode transistors 984 in FIG. 9C) coupled between the plurality of gain circuits and the plurality of current buffers. Each cascode transistor may be coupled between a gain circuit in one amplifier circuit and a current buffer in another amplifier circuit. The plurality of cascode transistors may be turned on when the plurality of amplifier circuits are enabled.

In an exemplary design, the plurality of amplifier circuits may comprise first and second amplifier circuits. The first amplifier circuit (e.g., amplifier circuit 650a in FIG. 6A) may comprise a first gain transistor (e.g., gain transistor 664a) and a first cascode transistor (e.g., cascode transistor 674a). The second amplifier circuit (e.g., amplifier circuit 650b) may comprise a second gain transistor (e.g., gain transistor 664a) and a second cascode transistor (e.g., cascode transistor 674a). In an exemplary design, a separate source degeneration inductor may be used for each gain circuit. The first amplifier circuit may comprise a first inductor (e.g., inductor 666a) coupled between the source of the first gain transistor and circuit ground. The second amplifier circuit may comprise a second inductor (e.g., inductor 666b) coupled between the source of the second gain transistor and circuit ground. In another exemplary design, a shared source degeneration inductor (e.g., inductor 666 in FIG. 7B) may be used for the first and second gain transistors and may be coupled between the sources of these gain transistors and circuit ground.

In an exemplary design, the at least one interconnection circuit may comprise a switch (e.g., switch 682a in FIG. 6A or switch 682b in FIG. 7A) coupled between the drains of the first and second cascode transistors. The switch may be opened when only the first or second amplifier circuit is enabled and may be closed when both the first and second amplifier circuits are enabled. In an exemplary design, the switch may comprise first, second and third transistors. The first transistor (e.g., NMOS transistor 684a in FIG. 6A) may be coupled between the drain of the first cascode transistor and an intermediate node. The second transistor (e.g., NMOS transistor 684b) may be coupled between the intermediate node and the drain of the second cascode transistor. The third transistor (e.g., NMOS transistor 686) may be coupled between the intermediate node and circuit ground. In another exemplary design, the switch may comprise a transistor (e.g., NMOS transistor 688 in FIG. 7A) coupled between the drains of the first and second cascode transistors. The switch may also be implemented in other manners.

In another exemplary design, the at least one interconnection circuit may comprise a capacitor (e.g., capacitor 982 in FIG. 9A) coupled between the drains of the first and second gain transistors. The first cascode transistor may be turned on and the second cascode transistor may be turned off when the first amplifier circuit is enabled. The second cascode transistor may be turned on and the first cascode transistor may be turned off when the second amplifier circuit is enabled. The first and second cascode transistors may both be turned on when the first and second amplifier circuits are enabled.

In yet another exemplary design, the at least one interconnection circuit may comprise third and fourth cascode transistors. The third cascode transistor (e.g., cascode transistor 984a in FIG. 9C) may be coupled between the drain of the first gain transistor and the drain of the second cascode transistor. The fourth cascode transistor (e.g., cascode transistor 984b) may be coupled between the drain of the second gain transistor and the drain of the first cascode transistor. The third and fourth cascode transistors may be turned on when the first and second amplifier circuits are both enabled. Only the first cascode transistor may be turned on, or both the first and fourth cascode transistors may be turned on, when the first amplifier circuit is enabled. Only the second cascode transistor may be turned on, or both the second and third cascode transistors may be turned on, when the second amplifier circuit is enabled.

The apparatus may include first and second load circuits coupled to the first and second amplifier circuits, respectively. In an exemplary design, the first load circuit (e.g., load circuit 690a in FIG. 6A) may comprise a first transformer (e.g., transformer 692a) coupled to the first amplifier circuit. The second load circuit (e.g., load circuit 690b) may comprise a second transformer (e.g., transformer 692b) coupled to the second amplifier circuit. The first and second load circuits may also be implemented in other manners.

Figure 10:
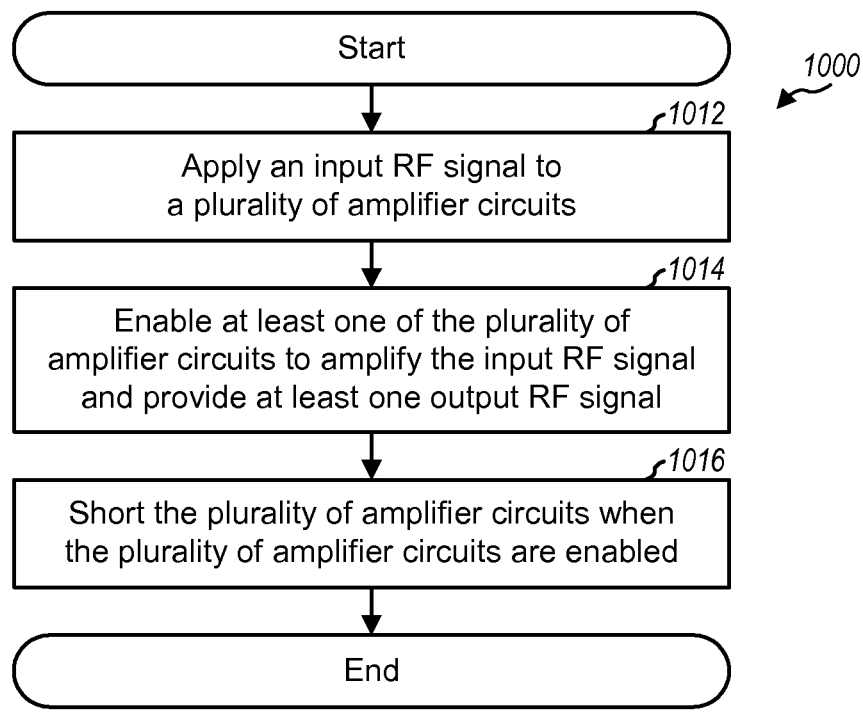
FIG. 10 shows a process for performing signal amplification.

FIG. 10 shows an exemplary design of a process 1000 for performing signal amplification. Process 1000 may be performed by a wireless device or by some other entity. An input RF signal may be applied to a plurality of amplifier circuits, which may have their inputs coupled together (block 1012). At least one of the plurality of amplifier circuits may be enabled to amplify the input RF signal and provide at least one output RF signal (block 1014). The plurality of amplifier circuits may be shorted via at least one interconnection circuit when the plurality of amplifier circuits are enabled in order to perform noise splitting and improve noise figure (block 1016). Each interconnection circuit may short the outputs or internal nodes of two amplifier circuits coupled to that interconnection circuit.

In an exemplary design of block 1014, the input RF signal may be amplified with a plurality of gain circuits in the plurality of amplifier circuits. The plurality of amplifier circuits may provide output currents. The output current from each amplifier circuit may comprise a portion of the current from each of the plurality of gain circuits.

The amplifiers (e.g., SIMO LNAs) with noise splitting described herein may be implemented on an IC, an analog IC, an RFIC, a mixed-signal IC, an ASIC, a printed circuit board (PCB), an electronic device, etc. The amplifiers with noise splitting may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an amplifier with noise splitting described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a plurality of amplifier circuits having a respective plurality of outputs each configured to couple with a respective one of a plurality of load circuits, the plurality of amplifier circuits configured to receive an input radio frequency (RF) signal; and
    at least one interconnection circuit configured to switchably short together at least two of the plurality of outputs of at least two of the plurality of amplifier circuits at a summing node with a respective at least two of the plurality of load circuits,
    wherein the plurality of amplifier circuits comprises first and second amplifier circuits, the first amplifier circuit comprising a first gain transistor and a first cascode transistor, and the second amplifier circuit comprising a second gain transistor and a second cascode transistor, and
    wherein the at least one interconnection circuit comprises a third cascode transistor coupled between a drain of the first gain transistor and a drain of the second cascode transistor, and a fourth cascode transistor coupled between a drain of the second gain transistor and a drain of the first cascode transistor.

2. The apparatus of claim 1, the plurality of amplifier circuits comprising a plurality of gain circuits and a plurality of current buffers, one gain circuit and one current buffer for each amplifier circuit.

3. The apparatus of claim 2, each amplifier circuit configured to provide an output current comprising a portion of a current from each of the plurality of gain circuits when the plurality of amplifier circuits are enabled to amplify the input RF signal and provide a plurality of output RF signals.

4. The apparatus of claim 2, wherein the outputs are outputs of the plurality of gain circuits and the at least one interconnection circuit configured to short the outputs of the plurality of gain circuits when the plurality of amplifier circuits are enabled.

5. The apparatus of claim 2, the at least one interconnection circuit comprising:
    a plurality of cascode transistors coupled between the plurality of gain circuits and the plurality of current buffers, each cascode transistor being coupled between a gain circuit in one amplifier circuit and a current buffer in another amplifier circuit, the plurality of cascode transistors being turned on when the plurality of amplifier circuits are enabled.

6. The apparatus of claim 1, the at least one interconnection circuit configured to short outputs of the plurality of amplifier circuits when the plurality of amplifier circuits are enabled.

7. The apparatus of claim 1, one of the plurality of amplifier circuits configured to amplify the input RF signal and provide an output RF signal when the one amplifier circuit is enabled and remaining ones of the plurality of amplifier circuits are disabled.

8. The apparatus of claim 1,
    the third and fourth cascode transistors being turned on when both the first and second amplifier circuits are enabled.

9. The apparatus of claim 8, only the first cascode transistor being turned on, or both the first and fourth cascode transistors being turned on, when the first amplifier circuit is enabled.

10. The apparatus of claim 1, further comprising:
    a first load circuit comprising a first transformer coupled to the first amplifier circuit; and
    a second load circuit comprising a second transformer coupled to the second amplifier circuit.

11. A method comprising:
    applying an input radio frequency (RF) signal to a plurality of amplifier circuits having a respective plurality of outputs each configured to couple with a respective one of a plurality of load circuits;
    enabling at least one of the plurality of amplifier circuits to amplify the input RF signal and provide at least one output RF signal; and
    switchably shorting together at least two of the plurality of outputs of at least two of the plurality of amplifier circuits at a summing node with a respective at least two of the plurality of load circuits,
    wherein the plurality of amplifier circuits comprises first and second amplifier circuits, the first amplifier circuit comprising a first gain transistor and a first cascode transistor, and the second amplifier circuit comprising a second gain transistor and a second cascode transistor, and wherein the switchably shorting comprises utilizing a third cascode transistor coupled between a drain of the first gain transistor and a drain of the second cascode transistor, and a fourth cascode transistor coupled between a drain of the second gain transistor and a drain of the first cascode transistor.

12. The method of claim 11, further comprising:
amplifying the input RF signal with a plurality of gain circuits in the plurality of amplifier circuits; and
providing output currents from the plurality of amplifier circuits, an output current from each amplifier circuit comprising a portion of a current from each of the plurality of gain circuits.

13. An apparatus comprising:
a plurality of amplifying means having a respective plurality of outputs each configured to couple with a respective one of a plurality of loading means, the plurality of amplifier means configured to receive an input radio frequency (RF) signal; and
at least one interconnection means configured to switchably short together at least two of the plurality of outputs of at least two of the plurality of amplifying means at a summing node with a respective at least two of the plurality of loading means,
wherein the plurality of amplifying means comprises first and second amplifying means, the first amplifying means comprising a first gain means and a first cascode means, and the second amplifying means comprising a second gain means and a second cascode means, and
wherein the at least one interconnection means comprises a third cascode means coupled between the first gain means and the second cascode means, and a fourth cascode means coupled between the second gain means and the first cascode means.

14. The apparatus of claim 13, the plurality of amplifying means comprising:
a plurality of gain means configured to amplify the input RF signal; and
a plurality of buffer means coupled to the plurality of gain means, each amplifying means configured to provide an output current comprising a portion of a current from each of the plurality of gain means when the plurality of amplifying means are enabled.

15. An apparatus comprising:
a plurality of amplifier circuits having a respective plurality of outputs each configured to couple with a respective one of a plurality of load circuits, the plurality of amplifier circuits configured to receive an input radio frequency (RF) signal, the plurality of amplifier circuits comprising first and second amplifier circuits, the first amplifier circuit comprising a first gain transistor and a first cascode transistor, and the second amplifier circuit comprising a second gain transistor and a second cascode transistor;
at least one interconnection circuit configured to switchably short together at least two of the plurality of outputs of at least two of the plurality of amplifier circuits at a summing node with a respective at least two of the plurality of load circuits; and
an inductor coupled between the source of the first gain transistor and circuit ground.

16. The apparatus of claim 15, wherein the inductor is coupled between sources of the first and second gain transistors and the circuit ground.

* * * * *